US011621291B2

(12) United States Patent
Ikeda et al.

(10) Patent No.: US 11,621,291 B2
(45) Date of Patent: Apr. 4, 2023

(54) DISPLAY DEVICE

(71) Applicant: Japan Display Inc., Tokyo (JP)

(72) Inventors: Masanobu Ikeda, Tokyo (JP);
Yasuhiro Kanaya, Tokyo (JP);
Tadafumi Ozaki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 163 days.

(21) Appl. No.: 17/103,979

(22) Filed: Nov. 25, 2020

(65) Prior Publication Data
US 2021/0082995 A1 Mar. 18, 2021

Related U.S. Application Data

(63) Continuation of application No. PCT/JP2019/003536, filed on Jan. 31, 2019.

(30) Foreign Application Priority Data

May 31, 2018 (JP) .............................. JP2018-105473

(51) Int. Cl.
*H01L 27/15* (2006.01)
*H01L 33/38* (2010.01)
(Continued)

(52) U.S. Cl.
CPC .......... *H01L 27/156* (2013.01); *H01L 33/387* (2013.01); *H01L 33/58* (2013.01); *H01L 33/62* (2013.01)

(58) Field of Classification Search
CPC ........... H01L 27/156; H01L 2933/0091; H01L 2933/0041; H01L 33/50–508; H01L 33/62; H01L 33/58; H01L 33/387
See application file for complete search history.

(56) References Cited

U.S. PATENT DOCUMENTS 10,149,366 B1 * 12/2018 Tsai ................... H01L 27/3258
2012/0217521 A1 8/2012 Ohta
(Continued)

FOREIGN PATENT DOCUMENTS

CN 102293053 A 12/2011
CN 104508853 A 4/2015
(Continued)

OTHER PUBLICATIONS

International Search Report and Written Opinion dated Apr. 16, 2019, received for PCT Application No. PCT/JP2019/003536 filed on Jan. 31, 2019, 12 Pages including English Translation.
(Continued)

*Primary Examiner* — Latanya N Crawford Eason
(74) *Attorney, Agent, or Firm* — Xsensus LLP

(57) ABSTRACT

A display device includes a substrate, a plurality of pixels, a plurality of inorganic light-emitting elements, and a first light-shielding portion. The pixels are arrayed on the substrate. The inorganic light-emitting elements are provided corresponding to the respective pixels and each have a first side surface and a second side surface opposite to the first side surface. The first light-shielding portion is electrically coupled to the cathode of the corresponding inorganic light-emitting element and prevents output of light traveling in a direction intersecting the first side surface of the inorganic light-emitting element.

11 Claims, 19 Drawing Sheets

(51) Int. Cl.
  *H01L 33/58* (2010.01)
  *H01L 33/62* (2010.01)

(56) References Cited

U.S. PATENT DOCUMENTS

| | | |
|---|---|---|
| 2015/0155346 A1 | 6/2015 | Motoyama et al. |
| 2017/0194304 A1 | 7/2017 | Takeya et al. |
| 2017/0213502 A1 | 7/2017 | Henry et al. |
| 2018/0074372 A1 | 3/2018 | Takeya et al. |
| 2019/0067643 A1 | 2/2019 | Zhai et al. |
| 2020/0126477 A1 | 4/2020 | Henry et al. |

FOREIGN PATENT DOCUMENTS

| | | |
|---|---|---|
| CN | 107546338 A | 1/2018 |
| JP | 2011-114075 A | 6/2011 |
| JP | 2017-529557 A | 10/2017 |

OTHER PUBLICATIONS

Office Action dated Dec. 3, 2021, in corresponding Chinese patent Application No. 201980035565.4, 25 pages.

\* cited by examiner

DISPLAY DEVICE

CROSS-REFERENCE TO RELATED APPLICATION(S)

The present application is a bypass continuation of PCT international application Ser. No. PCT/JP2019/003536 filed on Jan. 31, 2019 which designates the United States, incorporated herein by reference, and which claims the benefit of priority from Japanese Patent Application No. 2018-105473, filed on May 31, 2018, incorporated herein by reference.

BACKGROUND

1. Technical Field

The present disclosure relates to a display device.

2. Description of the Related Art

Inorganic electroluminescent (EL) displays provided with inorganic light-emitting diodes (micro LEDs) serving as display elements have recently been attracting attention (for example, refer to Japanese Translation of PCT International Application Publication No. 2017-529557). In inorganic EL displays, a plurality of light-emitting elements that output light in different colors are arrayed on an array substrate. Inorganic EL displays do not require any light source because they are provided with self-emitting elements and have higher light use efficiency because light is output without passing through a color filter. Inorganic EL displays have higher environmental resistance than organic EL displays provided with organic light-emitting diodes (OLEDs) serving as display elements.

In inorganic EL displays, a plurality of light-emitting elements that output light in different colors are disposed side by side. As a result, color mixture of light may possibly occur.

An object of the present disclosure is to provide a display device that can prevent color mixture of light.

SUMMARY

A display device according to an aspect of the present disclosure comprising: a substrate; a plurality of pixels arrayed on the substrate; a plurality of inorganic light-emitting elements provided corresponding to the respective pixels and each having a first side surface and a second side surface opposite to the first side surface; and a first light-shielding portion electrically coupled to a cathode of the corresponding inorganic light-emitting element and that prevents output of light traveling in a direction intersecting the first side surface of the inorganic light-emitting element.

DETAILED DESCRIPTION OF THE PREFERRED EMBODIMENTS

Figure 1:
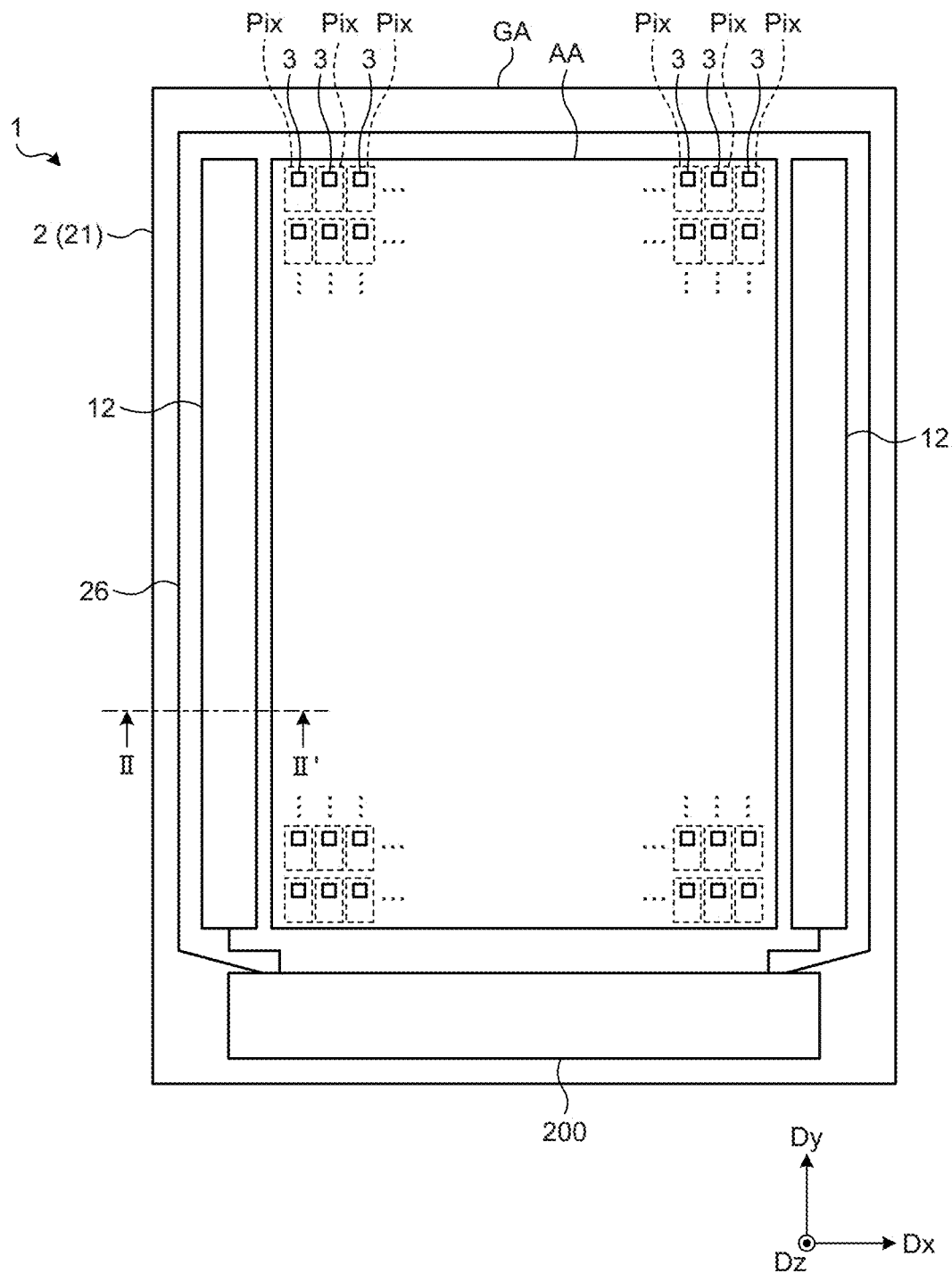
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith.

Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

Figure 2:
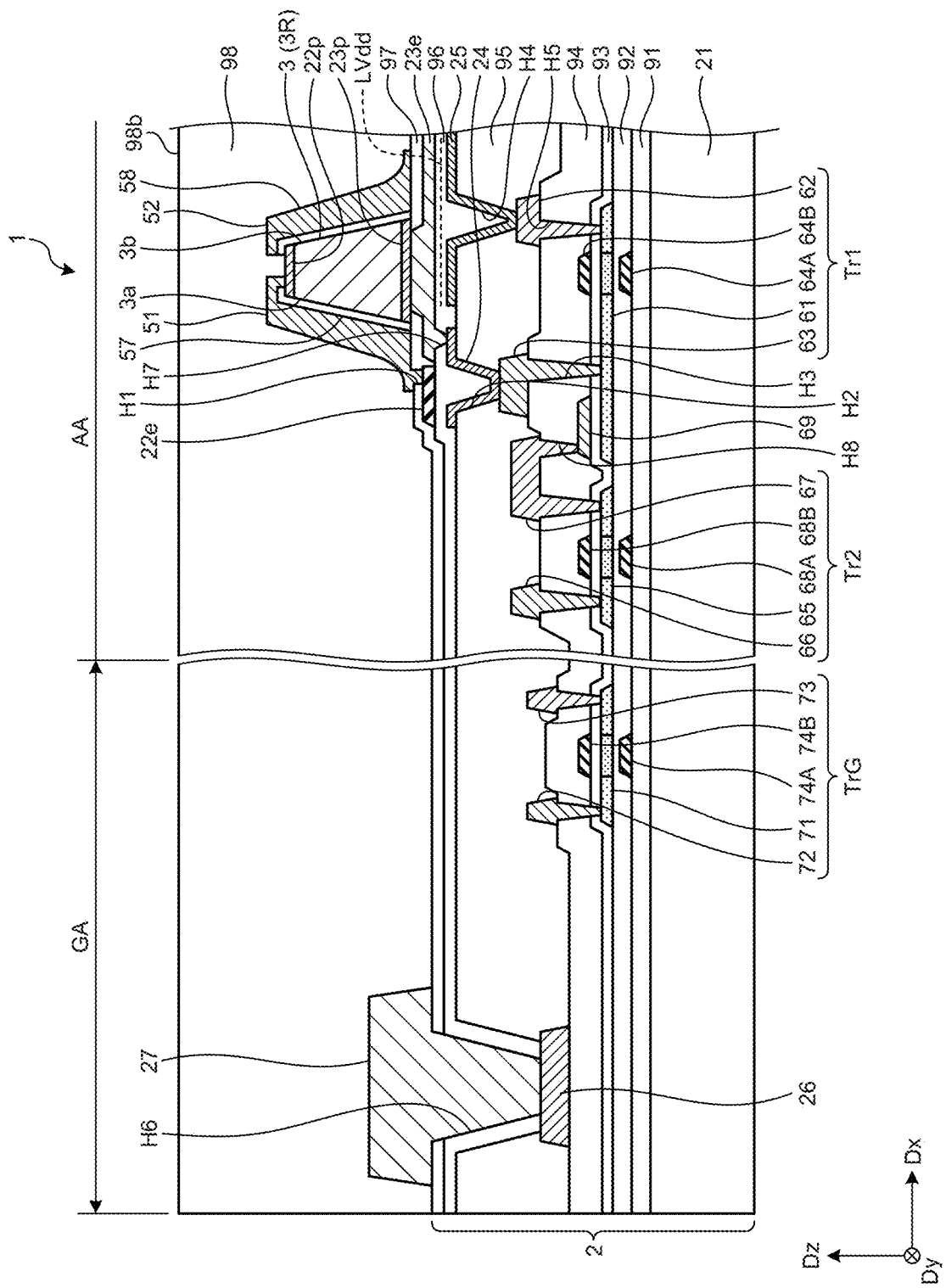
FIG. 2 is a sectional view along line II-II' of FIG. 1.
Figure 3:
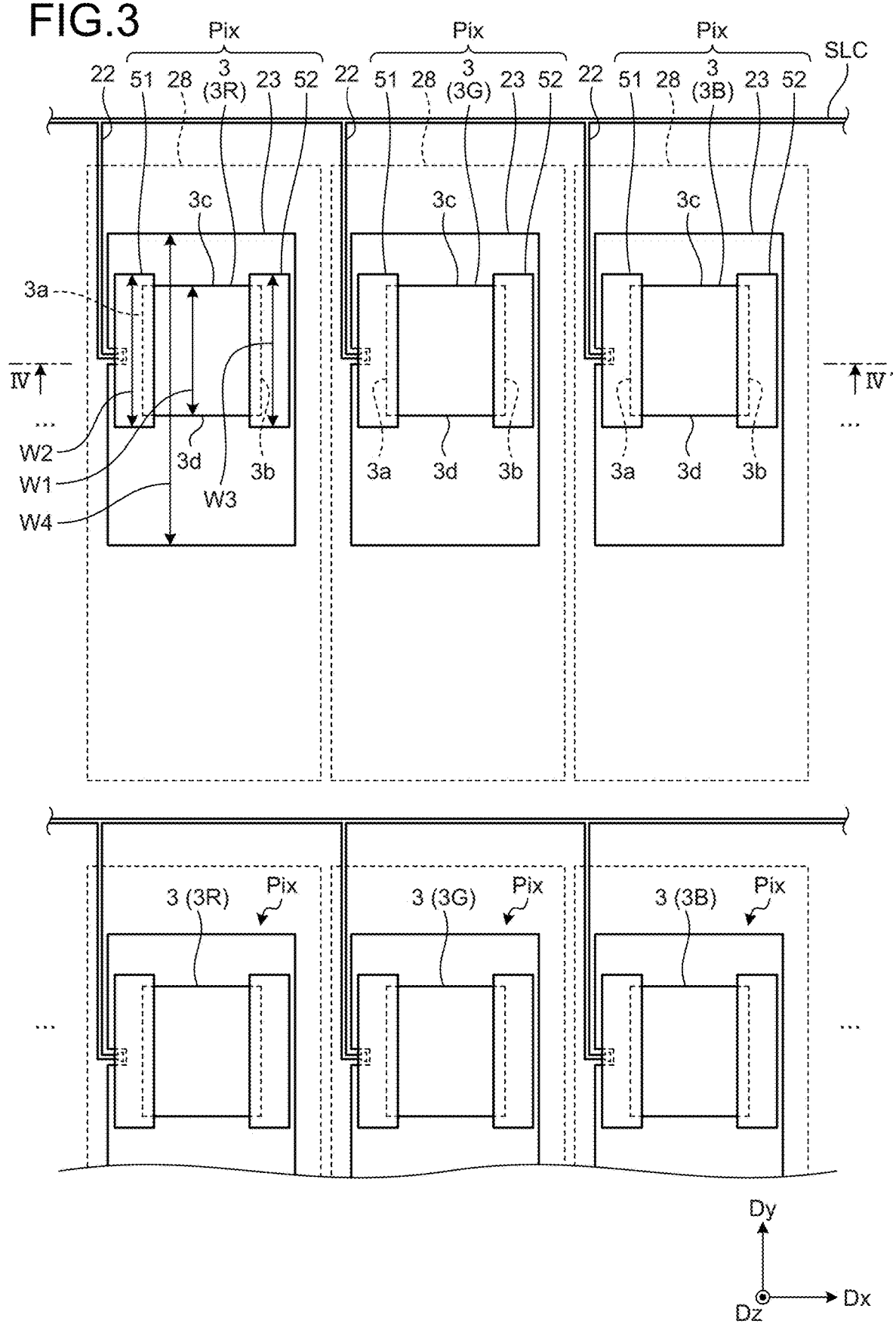
FIG. 3 is a plan view of a plurality of pixels.
Figure 4:
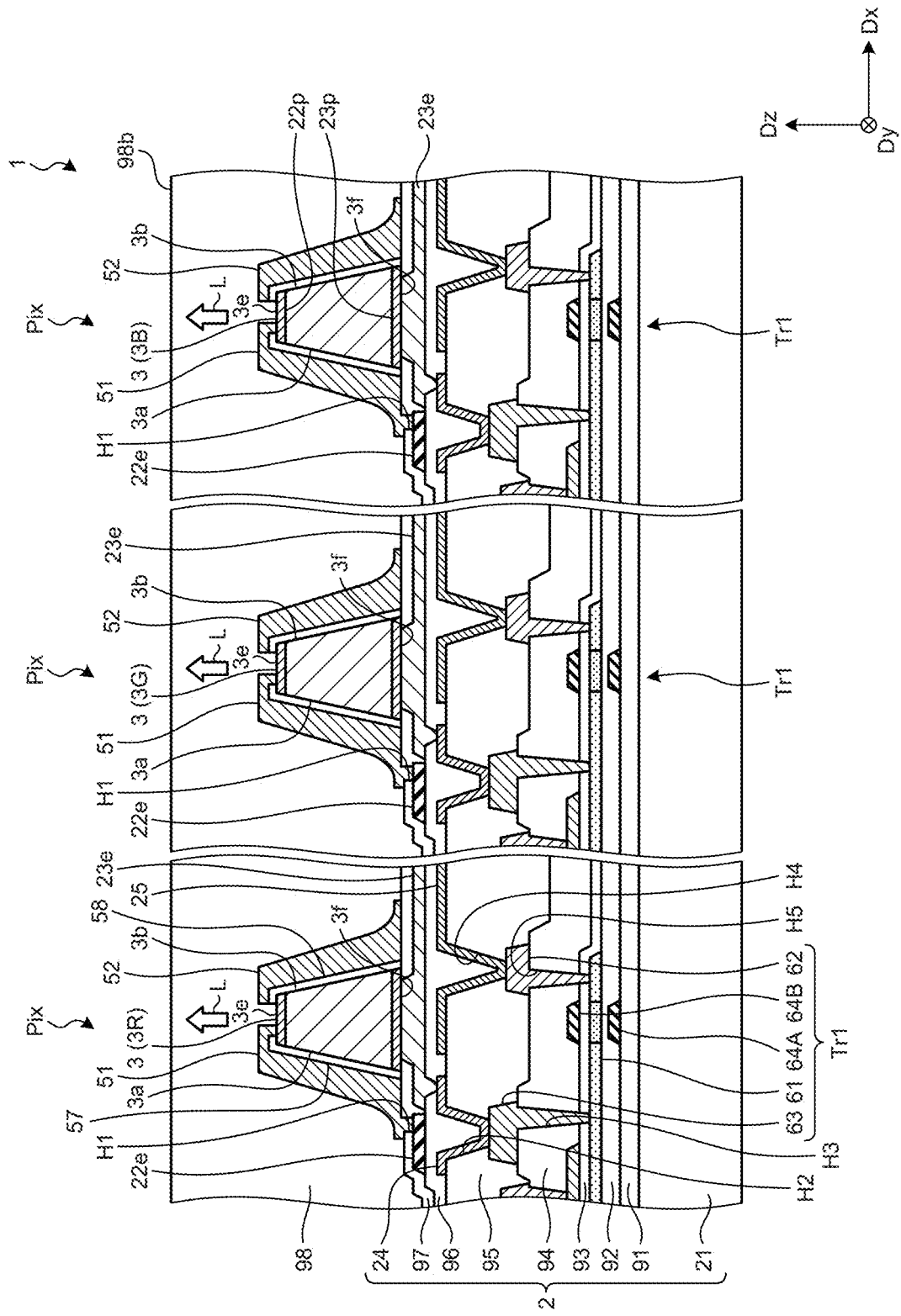
FIG. 4 is a sectional view along line IV-IV' of FIG. 3.

FIG. 1 is a plan view schematically illustrating a display device according to a first embodiment. FIG. 2 is a sectional view along line II-II' of FIG. 1. FIG. 3 is a plan view of a plurality of pixels. FIG. 4 is a sectional view along line IV-IV' of FIG. 3.

As illustrated in FIG. 1, a display device 1 includes an array substrate 2, a plurality of pixels Pix, drive circuits 12, a drive integrated circuit (IC) 200, and cathode wiring 26. The array substrate 2 is a drive circuit board for driving the pixels Pix and is also called a backplane or an active matrix substrate. The array substrate 2 is provided with a substrate 21, first transistors Tr1, second transistors Tr2, gate line transistors TrG (refer to FIG. 2), and various kinds of wiring, for example. The first transistors Tr1, the second transistors Tr2, and other transistors are switching elements provided to the respective pixels Pix. The gate line transistors TrG are switching elements included in the drive circuits 12.

As illustrated in FIG. 1, the display device 1 has a display region AA and a peripheral region GA. The display region AA is provided with the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The pixels Pix each include a light-emitting element 3. The display device 1 displays an image by outputting light in different colors from the respective light-emitting elements 3. The light-emitting element 3 is an inorganic light-emitting diode (LED) chip having a size of approximately 3 μm to 300 μm in planar view and is called a micro LED. A display device including the micro LEDs in the respective pixels is also called a micro LED display device. The term "micro" of the micro LED is not intended to limit the size of the light-emitting element 3.

The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed from the third direction Dz.

The drive circuits 12 drive a plurality of gate lines (first gate lines GCL1 and second gate lines GCL2 (refer to FIG. 7)) based on various control signals received from the drive IC 200. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 200 is a circuit that controls display on the display device 1. The drive IC 200 may be mounted on the peripheral region GA of the substrate 21 by chip-on-glass (COG) bonding. The mounting form of the drive IC 200 is not limited thereto, and the drive IC 200 may be mounted on FPCs or a rigid substrate coupled to the peripheral region GA of the substrate 21 by chip-on-film (COF) bonding.

The cathode wiring 26 is provided in the peripheral region GA of the substrate 21. The cathode wiring 26 is provided surrounding the pixels Pix in the display region AA and the drive circuits 12 in the peripheral region GA. Cathodes of a plurality of light-emitting elements 3 are coupled to the common cathode wiring 26 and supplied with a fixed potential (e.g., a ground potential) from the cathode wiring 26, for example. More specifically, a cathode terminal 22p (second terminal) of the light-emitting element 3 is coupled to the cathode wiring 26 via a first electrode 22e (cathode electrode) provided to a TFT substrate.

As illustrated in FIG. 2, the light-emitting element 3 is provided on the array substrate 2. The array substrate 2 includes the substrate 21, the switching elements, such as the first transistors Tr1 and the second transistors Tr2, various kinds of wiring, and various kinds of insulating layers. The substrate 21 is an insulating substrate and is a glass substrate, a resin substrate, or a resin film, for example.

In the present specification, a direction from the substrate 21 to a surface 98b of a flattening layer 98 in a direction (third direction Dz) perpendicular to the surface of the substrate 21 is referred to as an "upper side". A direction from the surface 98b of the flattening layer 98 to the substrate 21 is referred to as a "lower side". The "planar view" indicates a view seen from the direction (third direction Dz) perpendicular to the surface of the substrate 21.

The first transistors Tr1 and the second transistors Tr2 are provided to the respective pixels Pix. The first transistors Tr1 and the second transistors Tr2 are thin-film transistors (TFTs) and are n-channel metal oxide semiconductor (MOS) TFTs in this example. The first transistor Tr1 includes a semiconductor 61, a source electrode 62, a drain electrode 63, a first gate electrode 64A, and a second gate electrode 64B. The first gate electrode 64A is provided on the substrate 21 with a first insulating layer 91 interposed therebetween.

A second insulating layer 92 is provided on the first insulating layer 91 to cover the first gate electrode 64A. The semiconductor 61 is provided on the second insulating layer 92. A third insulating layer 93 is provided on the second insulating layer 92 to cover the semiconductor 61.

The second gate electrode 64B is provided on the third insulating layer 93. The semiconductor 61 is provided between the first gate electrode 64A and the second gate electrode 64B in the direction perpendicular to the substrate 21 (hereinafter, referred to as the third direction Dz). A channel region is formed at a part of the semiconductor 61 overlapping the first gate electrode 64A and the second gate electrode 64B.

In the example illustrated in FIG. 2, the first transistor Tr1 has what is called a dual-gate structure. The first transistor Tr1 may have a bottom-gate structure including the first gate electrode 64A and not including the second gate electrode 64B. Alternatively, the first transistor Tr1 may have a top-gate structure including the second gate electrode 64B alone and not including the first gate electrode 64A.

The semiconductor 61 is made of amorphous silicon, microcrystalline oxide semiconductor, amorphous oxide semiconductor, polycrystalline silicon, low-temperature polycrystalline silicon (hereinafter, referred to as LTPS), or gallium nitride (GaN), for example. Examples of the oxide semiconductor include, but are not limited to, IGZO, zinc oxide (ZnO), ITZO, etc. IGZO is indium gallium zinc oxide, and ITZO is indium tin zinc oxide.

A fourth insulating layer 94 is provided on the third insulating layer 93 to cover the second gate electrode 64B. The source electrode 62 and the drain electrode 63 are provided on the fourth insulating layer 94. The source electrode 62 according to the present embodiment is electrically coupled to the semiconductor 61 through a contact hole H5. The drain electrode 63 is electrically coupled to the semiconductor 61 through a contact hole H3.

A fifth insulating layer 95 is provided on the fourth insulating layer 94 to cover the source electrode 62 and the drain electrode 63. The fifth insulating layer 95 is a flattening layer that flattens unevenness formed by the first transistor Tr1 and the various kinds of wiring. The first insulating layer 91, the second insulating layer 92, the third insulating layer 93, and the fourth insulating layer 94 are inorganic insulating layers and are made of inorganic insulating material, such as a silicon oxide film (SiO), a silicon nitride film (SiN), and a silicon oxynitride film (SiON). The inorganic insulating layers are not limited to single layers and may be multilayered films. The fifth insulating layer 95 is an organic insulating layer, for example.

The second transistor Tr2 includes a semiconductor 65, a source electrode 66, a drain electrode 67, a first gate electrode 68A, and a second gate electrode 68B. Detailed explanation of the second transistor Tr2 is omitted because it has a layer configuration similar to that of the first transistor Tr1. The drain electrode 67 of the second transistor Tr2 is coupled to coupling wiring 69 through a contact hole H8. The coupling wiring 69 is coupled to the first gate electrode 64A and the second gate electrode 64B of the first transistor Tr1.

While the semiconductor 65, the source electrode 66, the drain electrode 67, the first gate electrode 68A, and the second gate electrode 68B are provided to the same layers as those of the semiconductor 61, the source electrode 62, the drain electrode 63, the first gate electrode 64A, and the second gate electrode 64B, respectively, of the first transistor Tr1, they may be provided to different layers.

The gate line transistor TrG includes a semiconductor 71, a source electrode 72, a drain electrode 73, a first gate electrode 74A, and a second gate electrode 74B. The gate line transistor TrG is a switching element included in the drive circuits 12. Detailed explanation of the gate line transistor TrG is omitted because it has a layer configuration similar to that of the first transistor Tr1. The gate line transistor TrG may be formed in a layer different from those of the first transistor Tr1 and the second transistor Tr2.

The light-emitting element 3 is provided on the fifth insulating layer 95 with a sixth insulating layer 96 and a seventh insulating layer 97 interposed therebetween. The flattening layer 98 is provided on the seventh insulating layer 97 to cover the light-emitting element 3. The light-emitting element 3 has what is called a face-up structure in which the anode (anode terminal 23p) is provided at the lower part and the cathode (cathode terminal 22p) is provided at the upper part. A second electrode 23e is an anode electrode coupled to the anode (anode terminal 23p) of the light-emitting element 3. The second electrode 23e is provided on the sixth insulating layer 96 and coupled to a third electrode 24 through a contact hole H7. The third electrode 24 is provided on the fifth insulating layer 95 and coupled to the drain electrode 63 through a contact hole H2. As described above, the second electrode 23e and the third electrode 24 couple the anode of the light-emitting element 3 and the drain electrode 63 of the first transistor Tr1. A fourth electrode 25 is provided to the same layer as that of the third electrode 24 and coupled to the source electrode 62 through a contact hole H4. Like the first insulating layer 91, for example, the sixth insulating layer 96 and the seventh insulating layer 97 are inorganic insulating layers made of inorganic insulating material. Like the fifth insulating layer 95, for example, the flattening layer 98 is an organic insulating layer made of organic insulating material.

The fourth electrode 25 extends on the fifth insulating layer 95 and faces the second electrode 23e with the sixth insulating layer 96 interposed therebetween in the third direction Dz. With this configuration, capacitance is formed between the second electrode 23e and the fourth electrode 25. The capacitance formed between the second electrode 23e and the fourth electrode 25 is used as holding capacitance Cs of a pixel circuit 28.

The light-emitting element 3 has a first side surface 3a and a second side surface 3b opposite to the first side surface 3a. A first light-shielding portion 51 is provided facing the first side surface 3a of the light-emitting element 3. The first light-shielding portion 51 is electrically coupled to the cathode (cathode terminal 22p) of the light-emitting element 3 and coupled to the first electrode 22e through a contact hole H1. The first electrode 22e is a cathode electrode coupled to the cathode of the light-emitting element 3. The first electrode 22e is coupled to a coupler 27 provided in the peripheral region GA via partial cathode wiring sLC (refer to FIG. 3). The coupler 27 is electrically coupled to the cathode wiring 26 at the bottom of a contact hole H6 formed in the fifth insulating layer 95. As a result, the cathodes of the respective light-emitting elements 3 are each electrically coupled to the cathode wiring 26 via the first light-shielding portion 51 and the first electrode 22e. A second light-shielding portion 52 is provided facing the second side surface 3b of the light-emitting element 3.

In the display device 1, the array substrate 2 includes the layers from the substrate 21 to the first electrode 22e and the second electrode 23e. The array substrate 2 does not include the flattening layer 98, the light-emitting element 3, the first light-shielding portion 51, or the second light-shielding portion 52.

As illustrated in FIG. 3, the pixels Pix each include the light-emitting element 3, the second electrode 23e, the pixel circuit 28, the first light-shielding portion 51, and the second light-shielding portion 52. The light-emitting elements 3 are provided corresponding to the respective pixels Pix and include first light-emitting elements 3R, second light-emitting elements 3G, and third light-emitting elements 3B that output light in different colors. The first light-emitting element 3R outputs light in a first primary color (e.g., red). The second light-emitting element 3G outputs light in a second primary color (e.g., green). The third light-emitting element 3B outputs light in a third primary color (e.g., blue). In the following description, the first light-emitting element 3R, the second light-emitting element 3G, and the third light-emitting element 3B are simply referred to as the light-emitting elements 3 when they need not be distinguished from one another. The light-emitting elements 3 may output light in four or more different colors.

The pixel Pix including the first light-emitting element 3R, the pixel Pix including the second light-emitting element 3G, and the pixel Pix including the third light-emitting element 3B are repeatedly arrayed in this order in the first direction Dx. In other words, the first light-emitting element 3R, the second light-emitting element 3G, and the third light-emitting element 3B are repeatedly arrayed in this order in the first direction Dx. The first light-emitting elements 3R, the second light-emitting elements 3G, and the third light-emitting elements 3B are each arrayed in the second direction Dy. In other words, in the example illustrated in FIG. 2, the light-emitting elements 3 are each disposed side by side with other light-emitting elements 3 that output light in different colors in the first direction Dx. The light-emitting elements 3 are each disposed side by side with other light-emitting elements 3 that output light in the same color in the second direction Dy.

As illustrated in FIG. 3, the second electrode 23e has a larger area than the light-emitting element 3 when viewed from the third direction Dz. In FIG. 3, the outer shape of the light-emitting element 3 corresponds to the outer shape of a lower surface 3f (refer to FIG. 4). In other words, the second electrode 23e has a larger area than the lower surface 3f when viewed from the third direction Dz. The second electrode 23e is made of metal material that reflects light. The second electrode 23e reflects, toward a display surface, light reflected by the surface 98b of the flattening layer 98, a cover member, or the like and traveling toward the array substrate 2 in light L output from the light-emitting element 3. With this configuration, the display device 1 can increase the use efficiency of the light L output from the light-emitting element 3. Examples of the material of the second electrode 23e include, but are not limited to, aluminum (Al) or aluminum alloy material, copper (Cu), copper alloy, silver (Ag) or silver alloy material, etc. As described above, the second electrode 23e serves not only as a reflective plate that reflects light but also as an electrode of the holding capacitance Cs.

The pixel circuit 28 is a drive circuit that drives the light-emitting element 3. The pixel circuit 28 includes the first transistor Tr1, the second transistor Tr2, and other components provided corresponding to the light-emitting element 3.

As illustrated in FIG. 4, the first light-shielding portion 51 is provided facing the first side surface 3a of the light-emitting element 3 with an insulating layer 57 interposed therebetween. The first side surface 3a and the second side surface 3b are surfaces intersecting the first direction Dx out of the side surfaces of the light-emitting element 3. The first side surface 3a and the second side surface 3b are provided facing each other in one light-emitting element 3. In the light-emitting elements 3 disposed side by side in the first direction Dx, the second side surface 3b of the first light-emitting element 3R faces the first side surface 3a of the second light-emitting element 3G. The second side surface 3b of the second light-emitting element 3G faces the first side surface 3a of the third light-emitting element 3B.

The first light-shielding portion 51 is made of metal material, such as molybdenum (Mo), titanium (Ti), titanium nitride (TiN), aluminum (Al), copper (Cu), and silver (Ag), or alloy material including any of these materials as a main component, for example. With this structure, the first light-shielding portion 51 can reflect light output from the first side surface 3a of the light-emitting element 3 and prevent output of light traveling in a direction intersecting the first side surface 3a. The insulating layer 57 has an opening in a region overlapping the upper surface of the light-emitting element 3. The upper surface of the light-emitting element 3 is exposed from the first light-shielding portion 51, the second light-shielding portion 52, and the insulating layer 57. The insulating layer 57 is made of inorganic insulating material, such as a silicon oxide film ($SiO_2$), a silicon nitride film (SiN), and a silicon oxynitride film (SiON), for example. The insulating layer 57 is not limited to a single layer and may be a multilayered film. The insulating layer 57 may be made of chemically stable aluminum oxide (e.g., $Al_2O_3$).

The first light-shielding portion 51 electrically couples the cathode of the light-emitting element 3 and the first electrode 22e. Specifically, the first light-shielding portion 51 is provided to part of an upper surface 3e of the light-emitting element 3 and electrically coupled to the cathode terminal 22p. The first light-shielding portion 51 extends along the first side surface 3a, and the lower end of the first light-shielding portion 51 is coupled to the first electrode 22e through the contact hole H1 formed in the seventh insulating layer 97. As illustrated in FIG. 3, the first electrodes 22e are coupled to the respective light-emitting elements 3 arrayed in the first direction Dx. The first electrodes 22e arrayed in the first direction Dx are coupled to the common partial cathode wiring sLC. A plurality of partial cathode wires sLC are arrayed in the second direction Dy and coupled to the cathode wiring 26 illustrated in FIG. 1 in the peripheral region GA. As described above, the cathode of the light-emitting element 3 is coupled to the cathode wiring 26 via the first light-shielding portion 51, the first electrode 22e, and other components. In other words, the first light-shielding portion 51 serves not only as a reflective plate that reflects the light L but also as coupling wiring that couples the cathode of the light-emitting element 3 and the cathode wiring 26.

As illustrated in FIG. 4, the second light-shielding portion 52 is provided facing the second side surface 3b of the light-emitting element 3 with an insulating layer 58 interposed therebetween. The second light-shielding portion 52 is made of the same metal or alloy material as that of the first light-shielding portion 51. With this structure, the second light-shielding portion 52 can reflect light output from the second side surface 3b of the light-emitting element 3 and prevent output of light traveling in a direction intersecting the second side surface 3b. The second light-shielding portion 52 is provided to part of the upper surface 3e of the light-emitting element 3 and electrically coupled to the cathode (cathode terminal 22p). The second light-shielding portion 52 extends along the second side surface 3b, and the lower end of the second light-shielding portion 52 is provided on the seventh insulating layer 97. The second light-shielding portion 52 is electrically separated from the second electrode 23e. The second light-shielding portion 52 may be coupled to the first electrode 22e or the partial cathode wiring sLC through a contact hole formed in the seventh insulating layer 97.

The first light-shielding portion 51 and the second light-shielding portion 52 may be formed in any way. The first light-shielding portion 51 and the second light-shielding portion 52 may be formed by applying a paste including the metal or alloy material described above to each light-emitting element 3 using a capillary or a dispenser, for example. Alternatively, the first light-shielding portion 51 and the second light-shielding portion 52 may be applied and formed by ink-jet printing, for example.

As illustrated in FIG. 3, a width W2 of the first light-shielding portion 51 in the second direction Dy and a width W3 of the second light-shielding portion 52 in the second direction Dy are larger than a width W1 of the light-emitting element 3 in the second direction Dy. The width W2 of the first light-shielding portion 51 in the second direction Dy and the width W3 of the second light-shielding portion 52 in the second direction Dy are smaller than a width W4 of the second electrode 23e in the second direction Dy.

With this configuration, the first light-shielding portion 51 is electrically coupled to the cathode of the light-emitting element 3 and prevents output of light traveling in the direction intersecting the first side surface 3a of the light-emitting element 3. The second light-shielding portion 52 prevents output of light traveling in the direction intersecting the second side surface 3b of the light-emitting element 3. As a result, the light L is output from a part of the upper surface 3e of the light-emitting element 3 between the first light-shielding portion 51 and the second light-shielding portion 52. Consequently, the display device 1 can prevent color mixture of the light L in different colors output from the light-emitting elements 3 disposed side by side in the first direction Dx.

In the present specification, color mixture of the light L means that the light L in different colors is mixed in the display device 1, and the light L resulting from the mixing of a plurality of different colors is output from the surface 98b of the flattening layer 98. In other words, the display device 1 outputs the light L emitted from the light-emitting elements 3 individually from the surface 98b of the flattening layer 98.

In the example illustrated in FIGS. 3 and 4, the display device 1 can prevent color mixture of the red light L output from the first light-emitting element 3R and the green light L output from the second light-emitting element 3G in the first light-emitting element 3R and the second light-emitting element 3G disposed side by side in the first direction Dx.

The display device 1 can also prevent color mixture of the green light L output from the second light-emitting element 3G and the blue light L output from the third light-emitting element 3B in the second light-emitting element 3G and the third light-emitting element 3B disposed side by side in the first direction Dx.

As illustrated in FIG. 3, a third side surface 3c and a fourth side surface 3d between the first side surface 3a and the second side surface 3b are provided with no light-shielding portion. As a result, the third side surface 3c and the fourth side surface 3d are exposed between the first light-shielding portion 51 and the second light-shielding portion 52. In the configuration according to the present embodiment, a plurality of light-emitting elements 3 that output light in the same color are disposed side by side in the second direction Dy. With this configuration, the display device 1 can prevent color mixture with no light-shielding portion provided for the third side surface 3c and the fourth side surface 3d.

Figure 5:
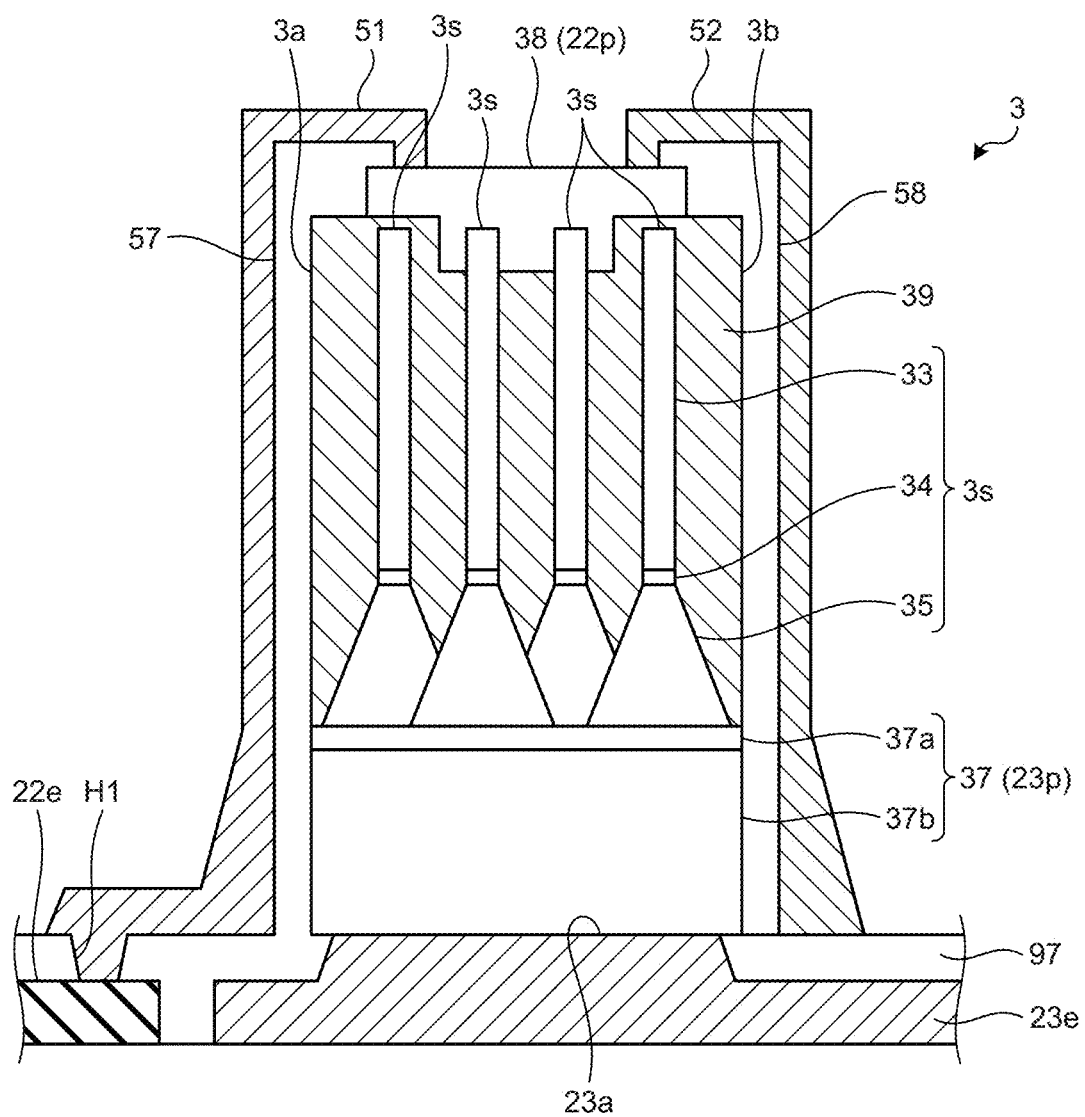
FIG. 5 is a sectional view of a light-emitting element according to the first embodiment.

FIG. 5 is a sectional view of the light-emitting element according to the first embodiment. As illustrated in FIG. 5, the light-emitting element 3 includes a plurality of partial light-emitting elements 3s, a protective layer 39, a p-type electrode 37, and an n-type electrode 38. The protective layer 39 covers the partial light-emitting elements 3s. The partial light-emitting elements 3s have a columnar shape and are provided between the p-type electrode 37 and the n-type electrode 38. The partial light-emitting elements 3s each include an n-type cladding layer 33, an active layer 34, and a p-type cladding layer 35. The n-type electrode 38 includes the cathode terminal 22p (first terminal) and is electrically coupled to the n-type cladding layer 33. The p-type electrode 37 includes the anode terminal 23p (second terminal) and is electrically coupled to the p-type cladding layer 35. The p-type cladding layer 35, the active layer 34, and the n-type cladding layer 33 are layered in order on the p-type electrode 37.

The n-type cladding layer 33, the active layer 34, and the p-type cladding layer 35 are light-emitting layers and are made of a compound semiconductor, such as gallium nitride (GaN) and aluminum indium phosphorus (AlInP).

The n-type electrode 38 is made of translucent conductive material, such as ITO. The n-type electrode 38 serves as the cathode of the light-emitting element 3 and is coupled to the first electrode 22e via the first light-shielding portion 51. The p-type electrode 37 serves as the anode of the light-emitting element 3 and includes a Pt layer 37a and a thick Au layer 37b produced by plating. The thick Au layer 37b is coupled to a placement surface 23a of the second electrode 23e.

The protective layer 39 is a spin on glass (SOG), for example. The side surfaces of the protective layer 39 correspond to the first side surface 3a and the second side surface 3b of the light-emitting element 3. The first light-shielding portion 51 and the second light-shielding portion 52 are provided facing the side surfaces of the protective layer 39.

Figure 6:
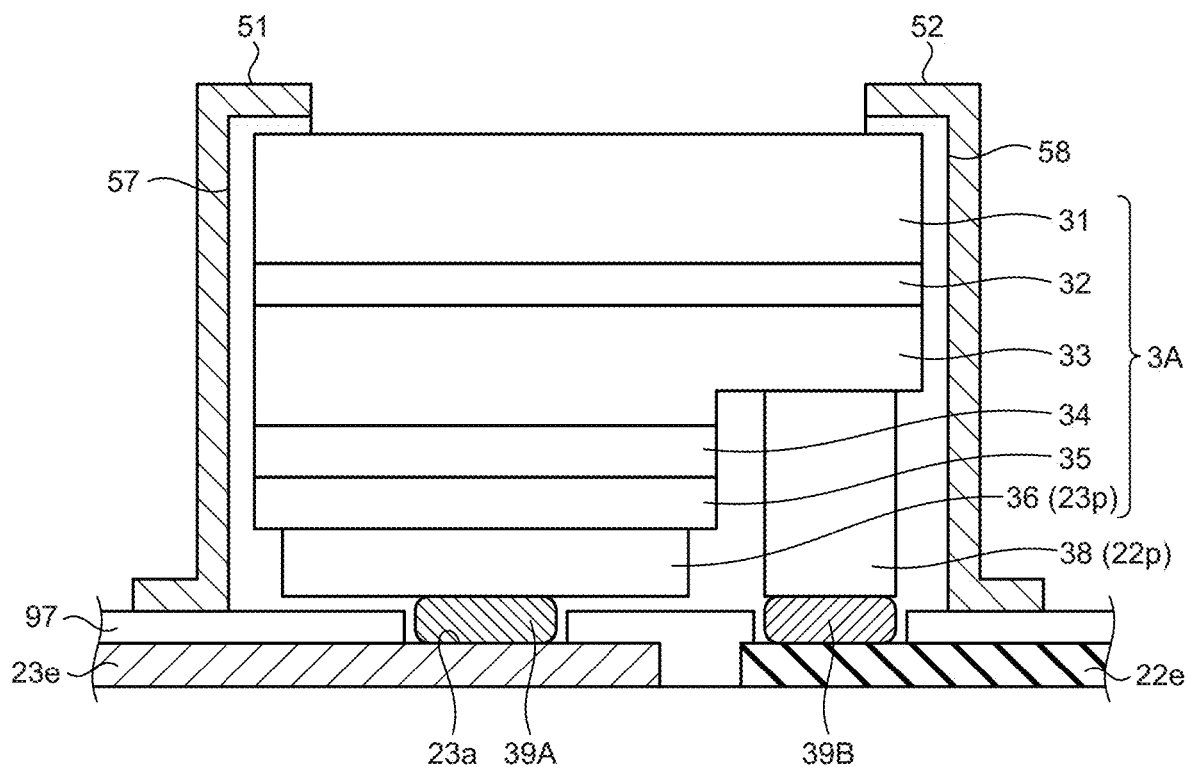
FIG. 6 is a sectional view of a modification of the light-emitting element according to the first embodiment.

The configuration illustrated in FIG. 5 is given by way of example only, and the light-emitting element 3 may have what is called a face-down structure, for example. FIG. 6 is a sectional view of a modification of the light-emitting element according to the first embodiment. In a light-emitting element 3A illustrated in FIG. 6, a buffer layer 32, the n-type cladding layer 33, the active layer 34, the p-type cladding layer 35, and a p-type electrode 36 (anode terminal 23p) are layered in order on a translucent substrate 31. In the light-emitting element 3A, the translucent substrate 31 is provided at the upper part, and the p-type electrode 36 is provided at the lower part. The surface of the n-type cladding layer 33 facing the first electrode 22e has a region exposed from the active layer 34. This region is provided with the n-type electrode 38 (cathode terminal 22p).

The p-type electrode 36 is made of material having metallic luster that reflects light from the light-emitting layers. The p-type electrode 36 is coupled to the second electrode 23e serving as the anode electrode with a bump 39A interposed therebetween. The n-type electrode 38 is coupled to the first electrode 22e serving as the cathode electrode with a bump 39B interposed therebetween.

The first light-shielding portion 51 and the second light-shielding portion 52 are provided facing the side surfaces of the translucent substrate 31, the buffer layer 32, the n-type cladding layer 33, the active layer 34, the p-type cladding layer 35, and the p-type electrode 36. In the light-emitting element 3A, the p-type cladding layer 35 and the n-type cladding layer 33 are not directly bonded, and another layer (light-emitting layer (active layer 34)) is provided therebetween. With this configuration, carriers, such as electrons and holes, can be concentrated in the light-emitting layer, thereby efficiently recombining the carriers (emitting light). The light-emitting layer may have a multi-quantum well structure (MQW structure) in which well layers and barrier layers composed of several atomic layers are cyclically layered for higher efficiency.

Figure 7:
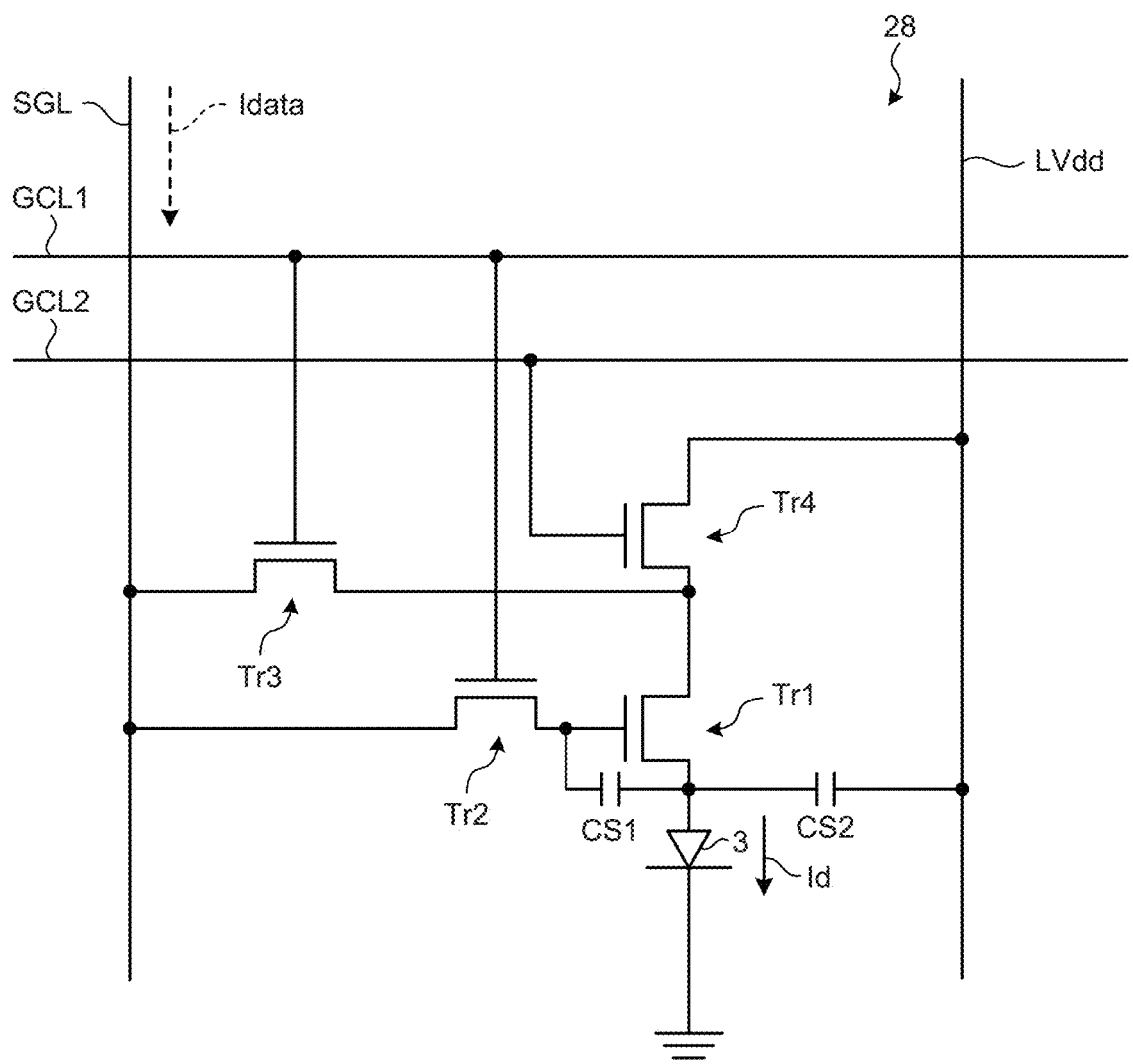
FIG. 7 is a circuit diagram of a pixel circuit.
Figure 8:
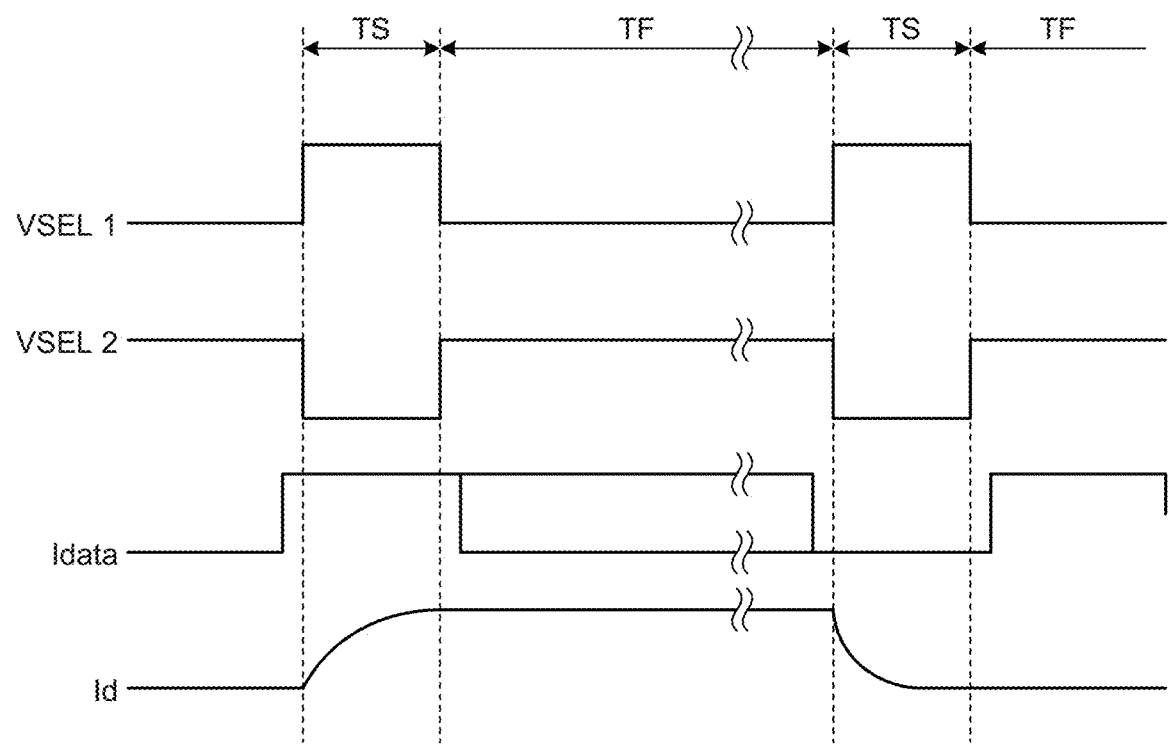
FIG. 8 is a timing waveform chart of an exemplary operation of the display device.

FIG. 7 is a circuit diagram of the pixel circuit. FIG. 8 is a timing waveform chart of an exemplary operation of the display device. As illustrated in FIG. 7, the pixel circuit 28 includes a plurality of switching elements (the first transistor Tr1, the second transistor Tr2, a third transistor Tr3, and a fourth transistor Tr4), the first gate line GCL1, the second gate line GCL2, a signal line SGL, and a power-supply line LVdd.

The first transistor Tr1 is a drive TFT. The second transistor Tr2 is a switching TFT for switching a selection period TS (refer to FIG. 8) and a light-emission period FT (refer to FIG. 8). The third transistor Tr3 and the fourth transistor Tr4 are current switching TFTs. The signal line SGL is coupled to a constant current source. The power-supply line LVdd is coupled to a constant voltage source.

Holding capacitance Cs1 is formed between the drain of the second transistor Tr2 and the anode of the light-emitting element 3. Holding capacitance Cs2 is formed between the anode of the light-emitting element 3 and the power-supply line LVdd. With the holding capacitance Cs1 and Cs2, the pixel circuit 28 can prevent fluctuations in a gate voltage due to current leakage of the second transistor Tr2.

In the selection period TS, a first selection signal VSEL1 supplied to the first gate line GCL1 is turned ON (high-level voltage) as illustrated in FIG. 8. A second selection signal VSEL2 supplied to the second gate line GCL2 is turned OFF (low-level voltage). As a result, the second transistor Tr2 and the third transistor Tr3 are turned ON, and the fourth transistor Tr4 is turned OFF. The anode of the light-emitting element 3 is supplied with an electric current Idata from the signal line SGL.

In the light-emission period FT, the first selection signal VSEL1 is turned OFF, and the second selection signal VSEL2 is turned ON. As a result, the second transistor Tr2 and the third transistor Tr3 are turned OFF, and the fourth transistor Tr4 is turned ON. The anode of the light-emitting element 3 is supplied with an electric current Id from the power-supply line LVdd. The aspect illustrated in FIGS. 7 and 8 is given by way of example only, and the configuration of the pixel circuit 28 and the operations of the display device 1 may be appropriately modified.

Figure 9:
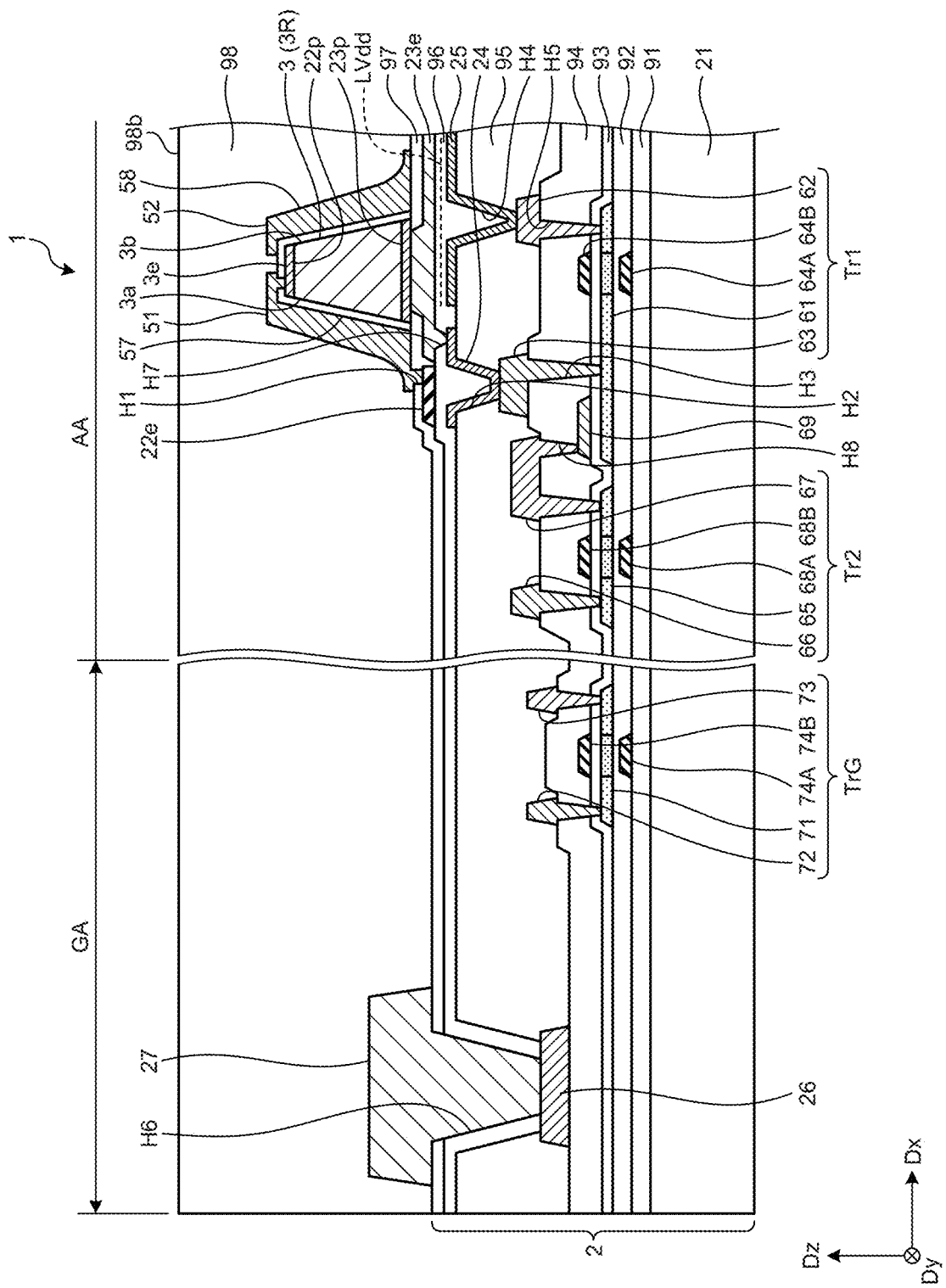
FIG. 9 is a sectional view schematically illustrating the display device according to a modification of the first embodiment.

FIG. 9 is a sectional view schematically illustrating the display device according to a modification of the first embodiment. As illustrated in FIG. 9, the insulating layer 57 is provided covering the first side surface 3a, the second side surface 3b, and the upper surface 3e of the light-emitting element 3. The insulating layer 57 has an opening at only a coupling part for the first light-shielding portion 51 and has no opening in a region not overlapping the first light-shielding portion 51 or the second light-shielding portion 52. With this configuration, the insulating layer 57 according to the present modification can be processed in fewer steps, thereby reducing damage to the light-emitting element 3 caused by processing the insulating layer 57. In addition, the present modification can prevent moisture and foreign matter from entering until the flattening layer 98 is formed in the process for manufacturing the display device 1. While one light-emitting element 3 (first light-emitting element 3R) is illustrated in FIG. 9, the configuration according to the present modification can also be applied to the first light-emitting element 3R, the second light-emitting element 3G, and the third light-emitting element 3B illustrated in FIG. 4. The configuration according to the present modification can also be applied to the light-emitting elements 3 illustrated in FIGS. 15, 17, and 18.

Second Embodiment

Figure 10:
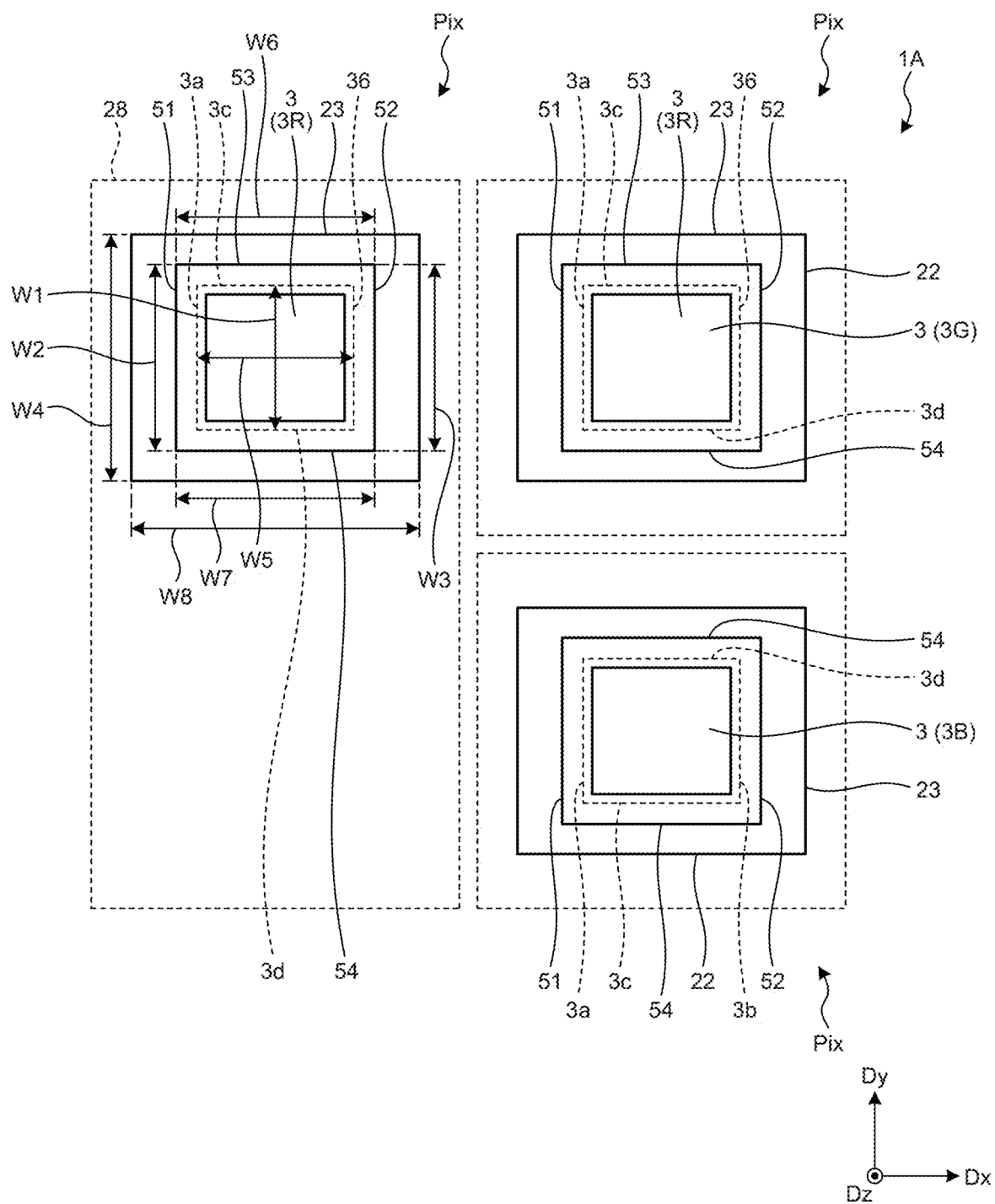
FIG. 10 is a plan view of a plurality of pixels of the display device according to a second embodiment.

FIG. 10 is a plan view of a plurality of pixels of the display device according to a second embodiment. In the following description, components described in the embodiment above are denoted by like reference numerals, and explanation thereof is omitted. As illustrated in FIG. 10, in a display device 1A according to the present embodiment, the pixel Pix including the second light-emitting element 3G and the pixel Pix including the third light-emitting element 3B are disposed side by side in the second direction Dy. The two pixels Pix disposed side by side in the second direction Dy are disposed side by side with one pixel Pix including the first light-emitting element 3R in the first direction Dx.

In other words, the first light-emitting element 3R and the second light-emitting element 3G are disposed side by side in the first direction Dx. The second light-emitting element 3G and the third light-emitting element 3B are disposed side by side in the second direction Dy. As described above, the light-emitting elements 3 that output light in different colors according to the present embodiment are disposed side by side in both the first direction Dx and the second direction Dy. With this positional relation, the first light-emitting elements 3R, the second light-emitting elements 3G, and the third light-emitting elements 3B are provided in a matrix (row-column configuration) in the display region AA. The first light-emitting element 3R may be disposed side by side with the third light-emitting element 3B in the first direction Dx.

The display device 11A includes third light-shielding portions 53 and fourth light-shielding portions 54 besides the first light-shielding portions 51 and the second light-shielding portions 52. The third light-shielding portion 53 and the fourth light-shielding portion 54 are provided facing the third side surface 3c and the fourth side surface 3d, respectively, of the light-emitting element 3. The first light-shielding portion 51, the second light-shielding portion 52, the third light-shielding portion 53, and the fourth light-shielding portion 54 are connected in a frame shape in planar view to surround the light-emitting element 3. The first light-shielding portion 51, the second light-shielding portion 52, the third light-shielding portion 53, and the fourth light-shielding portion 54 overlap the periphery of the upper surface 3e of the light-emitting element 3 and are electrically coupled to the cathode (cathode terminal 22p).

As illustrated in FIG. 10, a width W6 of the third light-shielding portion 53 in the first direction Dx and a width W7 of the fourth light-shielding portion 54 in the first direction Dx are larger than a width W5 of the light-emitting element 3 in the first direction Dx. The width W6 of the third light-shielding portion 53 in the first direction Dx and the width W7 of the fourth light-shielding portion 54 in the first direction Dx are smaller than a width W8 of the second electrode 23e in the first direction Dx.

With this configuration, the third light-shielding portion 53 prevents output of light traveling in a direction intersecting the third side surface 3c of the light-emitting element 3. The fourth light-shielding portion 54 prevents output of light traveling in a direction intersecting the fourth side surface 3d of the light-emitting element 3. As a result, the light L is output from a part of the upper surface 3e of the light-emitting element 3 surrounded by the first light-shielding portion 51, the second light-shielding portion 52, the third light-shielding portion 53, and the fourth light-shielding portion 54. Consequently, the display device 1 can prevent color mixture of the light L in different colors output from the light-emitting elements 3 disposed side by side in the second direction Dy. In the example illustrated in FIG. 10, the display device 1A can prevent color mixture of the green light L output from the second light-emitting element 3G and the blue light L output from the third light-emitting element 3B in the second light-emitting element 3G and the third light-emitting element 3B disposed side by side in the second direction Dy.

Third Embodiment

Figure 11:
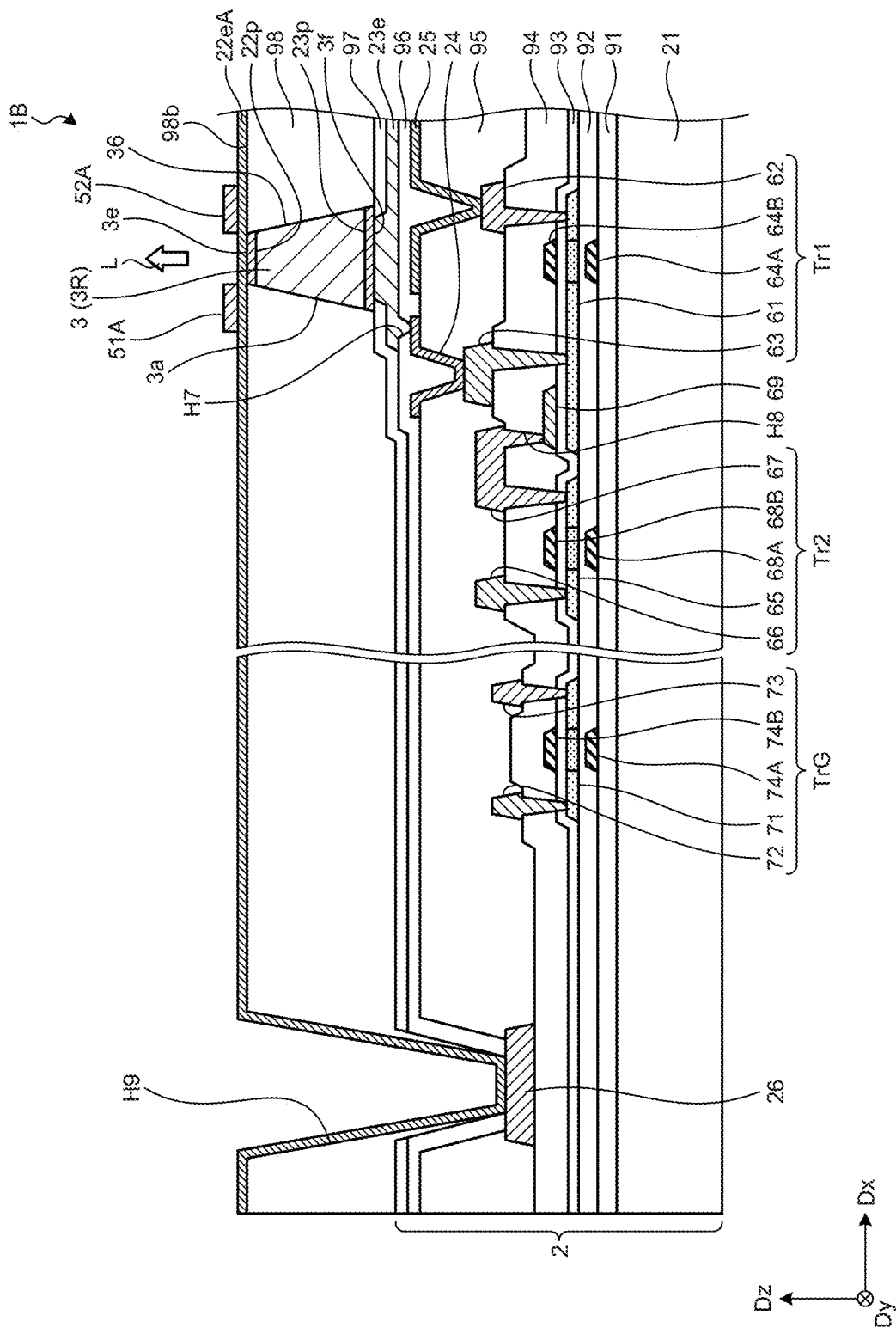
FIG. 11 is a sectional view for explaining coupling between the light-emitting element and cathode wiring of the display device according to a third embodiment.
Figure 12:
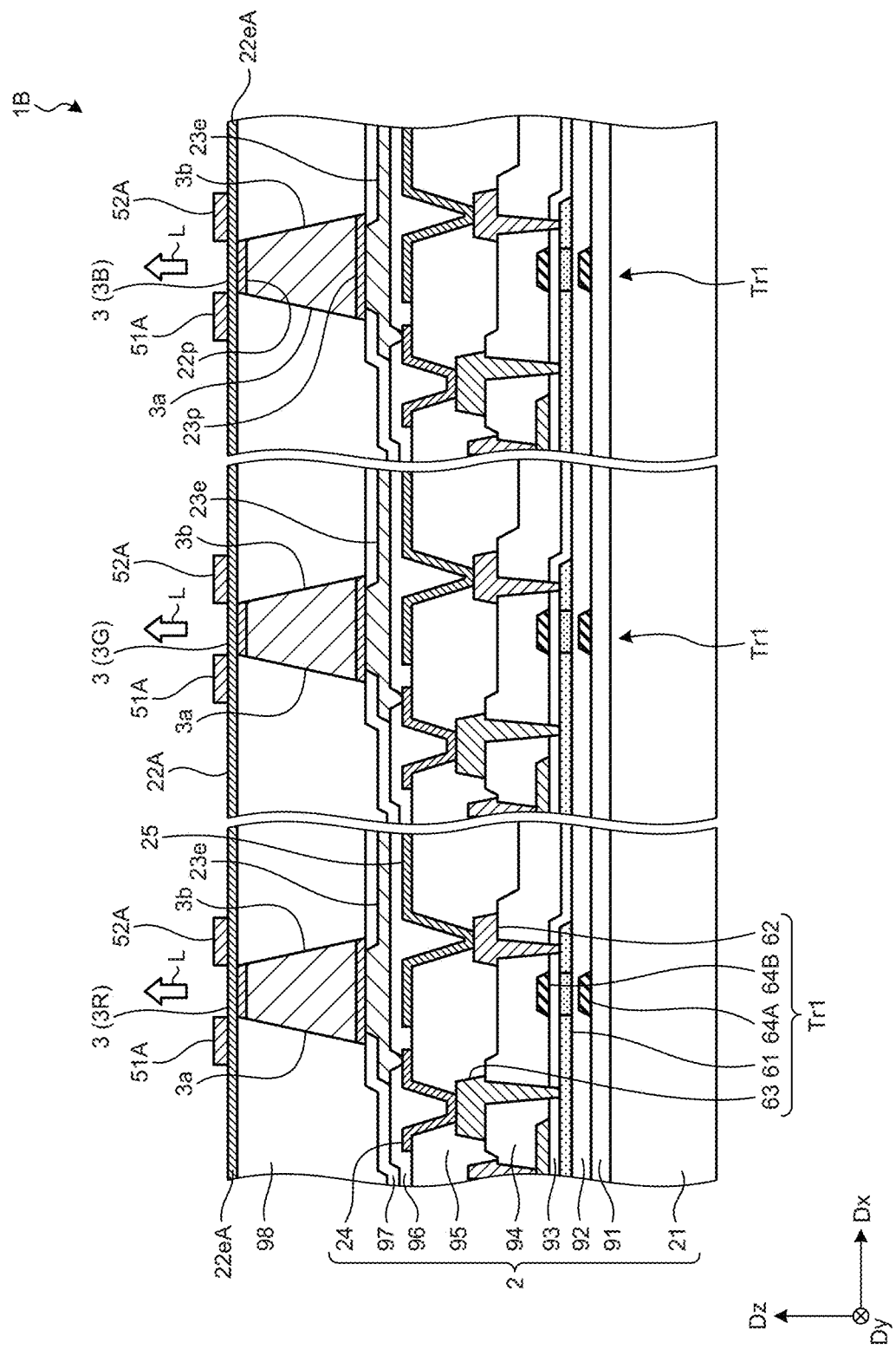
FIG. 12 is a sectional view of a plurality of pixels of the display device according to the third embodiment.

FIG. 11 is a sectional view for explaining coupling between the light-emitting element and the cathode wiring of the display device according to a third embodiment. FIG. 12 is a sectional view of a plurality of pixels of the display device according to the third embodiment. As illustrated in FIG. 11, the flattening layer 98 in a display device 1B according to the present embodiment is provided on the surface of the seventh insulating layer 97 to cover at least the side surfaces (the first side surface 3a and the second side surface 3b) of the light-emitting element 3. At least a part (cathode terminal 22p) of the upper surface 3e of the light-emitting element 3 is exposed from the flattening layer 98.

A first electrode 22eA is provided on the surface 98b of the flattening layer 98 and electrically coupled to the cathode of the light-emitting element 3. The first electrode 22eA extends to the peripheral region GA and is electrically coupled to the cathode wiring 26 through a contact hole H9 formed in the flattening layer 98. The first electrode 22eA is continuously provided for a plurality of pixels Pix and electrically coupled to the cathodes of the respective light-emitting elements 3. The first electrode 22eA is made of translucent conductive material, such as ITO.

A first light-shielding portion 51A and a second light-shielding portion 52A are provided on the first electrode 22eA and electrically coupled to the cathode of the light-emitting element 3 via the first electrode 22eA. The first light-shielding portion 51A and the second light-shielding portion 52A are separated in the first direction Dx and provided in regions overlapping the first side surface 3a and the second side surface 3b, respectively, in planar view. The configuration of the first light-shielding portion 51A and the second light-shielding portion 52A in planar view is the same as that of the first light-shielding portion 51 and the second light-shielding portion 52 illustrated in FIG. 3.

The first light-shielding portion 51A reflects light output from the first side surface 3a and traveling obliquely upward. The second light-shielding portion 52A reflects light output from the second side surface 3b and traveling obliquely upward. As a result, the first light-shielding portion 51A and the second light-shielding portion 52A can prevent light traveling in the directions intersecting the first side surface 3a and the second side surface 3b, respectively, from being output from the surface 98b of the flattening layer 98. The light L is output from the upper surface 3e of the light-emitting element 3 through a space between the first light-shielding portion 51A and the second light-shielding portion 52A.

As illustrated in FIG. 12, the first light-emitting element 3R, the second light-emitting element 3G, and the third light-emitting element 3B are each provided with the first light-shielding portion 51A and the second light-shielding portion 52A. With this configuration, the display device 1B can prevent color mixture of the light L in different colors output from the light-emitting elements 3 disposed side by side in the first direction Dx. In the example illustrated in FIG. 12, the second light-shielding portion 52A can reduce light traveling obliquely upward in a direction approaching the second light-emitting element 3G in the red light L output from the first light-emitting element 3R in the first light-emitting element 3R and the second light-emitting element 3G disposed side by side in the first direction Dx. The first light-shielding portion 51A can reduce light traveling obliquely upward in a direction approaching the first light-emitting element 3R in the green light L output from the second light-emitting element 3G. Consequently, the display device 1B can prevent color mixture of the red light L and the green light L. The display device 1B can also prevent color mixture of the green light L and the blue light L in the second light-emitting element 3G and the third light-emitting element 3B disposed side by side in the first direction Dx.

Similarly to the second embodiment illustrated in FIG. 10, the present embodiment may include a third light-shielding portion and a fourth light-shielding portion between the first light-shielding portion 51A and the second light-shielding portion 52A. In this case, the light-shielding portions may be provided in a frame shape.

Fourth Embodiment

Figure 13:
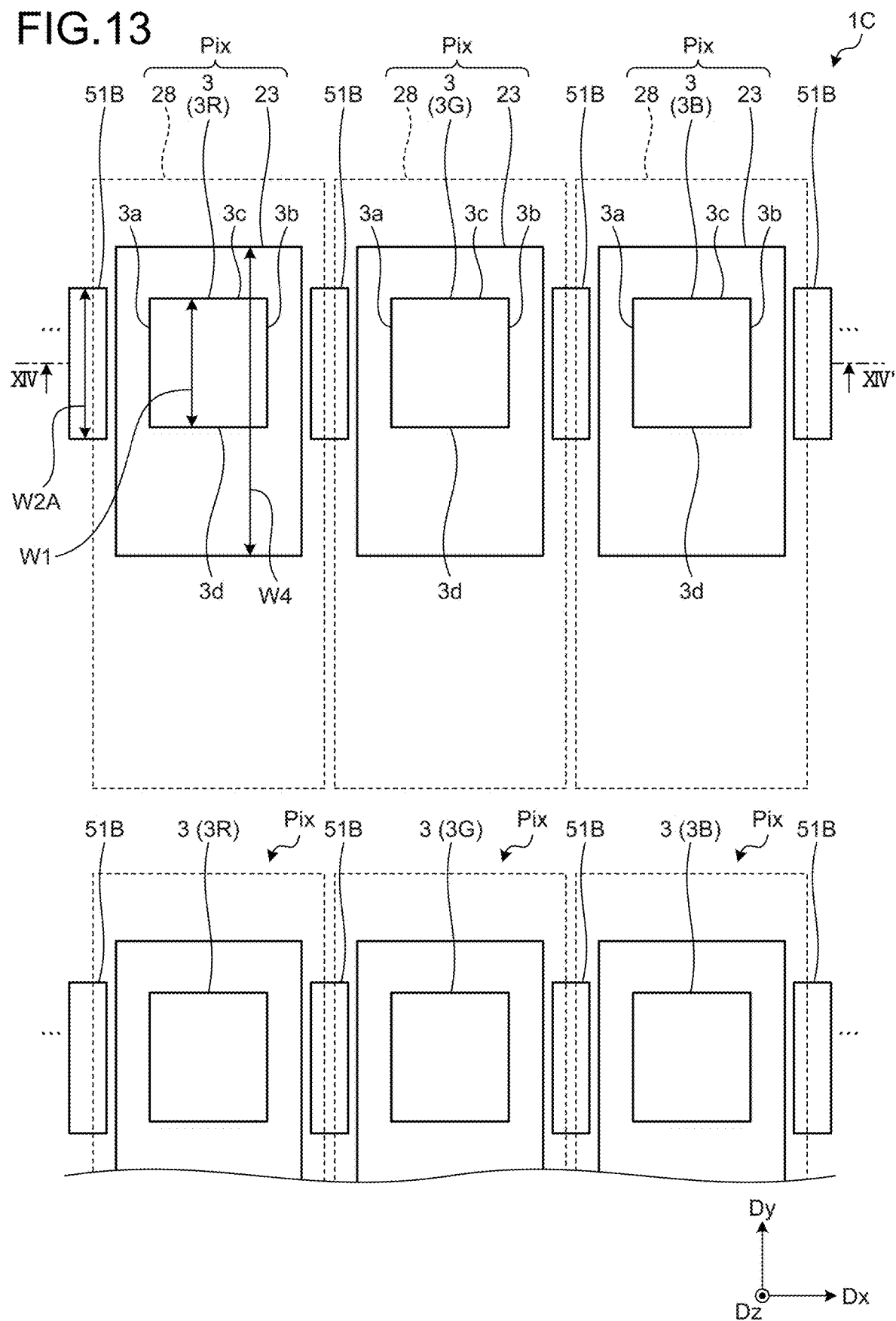
FIG. 13 is a plan view of a plurality of pixels of the display device according to a fourth embodiment.
Figure 14:
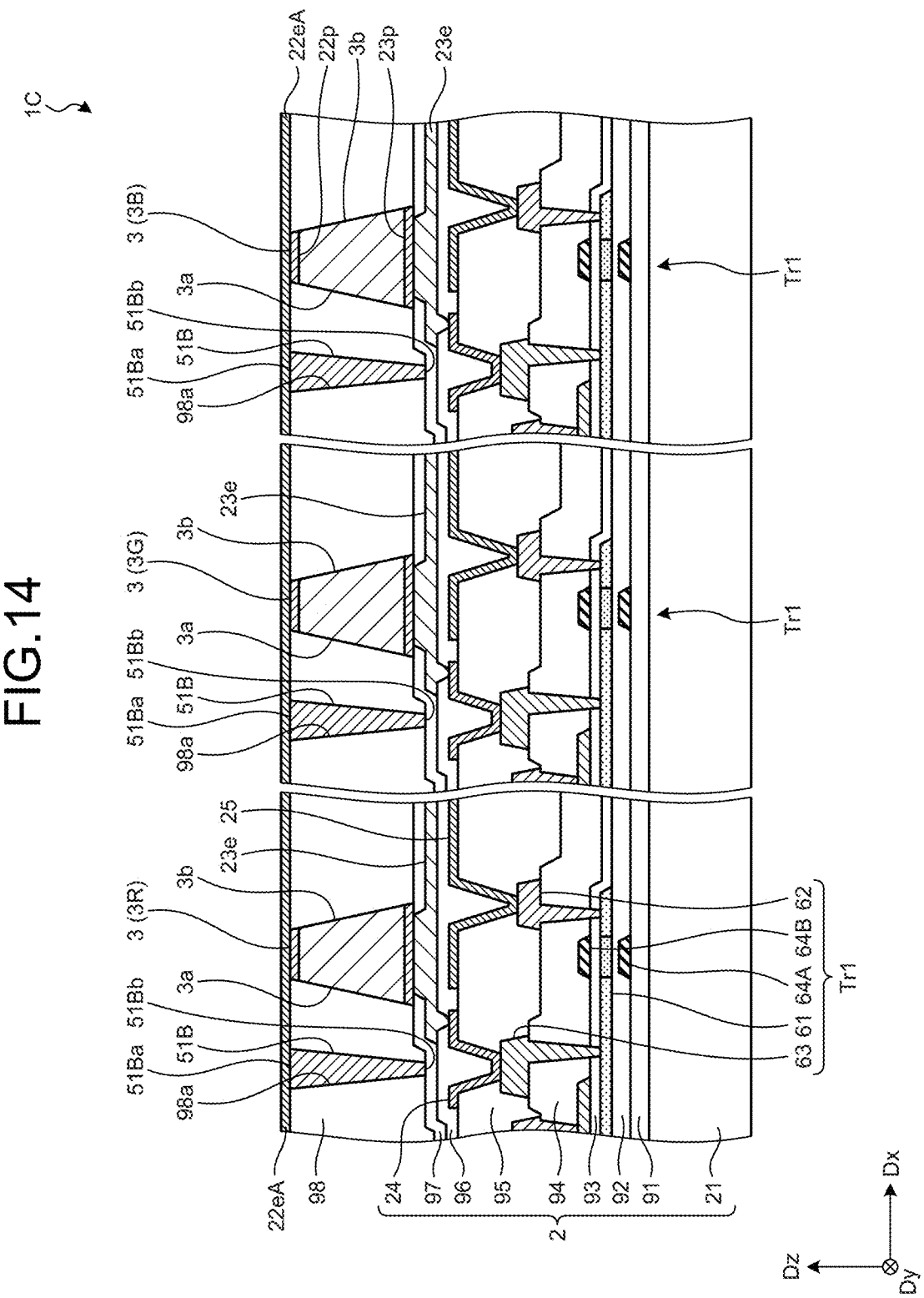
FIG. 14 is a sectional view along line XIV-XIV' of FIG. 13.

FIG. 13 is a plan view of a plurality of pixels of the display device according to a fourth embodiment. FIG. 14 is a sectional view along line XIV-XIV' of FIG. 13. As illustrated in FIG. 13, a display device 1C according to the present embodiment includes first light-shielding portions 51B each provided between the light-emitting elements 3 disposed side by side. The first light-shielding portion 51B is provided at a position not overlapping the light-emitting element 3 or the second electrode 23e. A width W2A of the first light-shielding portion 51B in the second direction Dy is larger than the width W1 of the light-emitting element 3 in the second direction Dy and smaller than the width W4 of the second electrode 23e in the second direction Dy.

As illustrated in FIG. 14, the flattening layer 98 has a groove 98a extending in the third direction Dz. The groove 98a passes through the flattening layer 98 in the third direction Dz. The present embodiment is not limited thereto, and the groove 98a may be simply bored on at least the surface 98b of the flattening layer 98. The bottom of the groove 98a may be separated from the seventh insulating layer 97 in the third direction Dz.

The first light-shielding portion 51B is embedded in the groove 98a. The first light-shielding portion 51B extends in the third direction Dz along the groove 98a and in the second direction Dy. The first light-shielding portion 51B has a wall shape intersecting the first direction Dx. An upper surface 51Ba of the first light-shielding portion 51B is in contact with the first electrode 22eA. As a result, the first light-shielding portion 51B is electrically coupled to the cathode of the light-emitting element 3 via the first electrode 22eA. A lower surface 51Bb of the first light-shielding portion 51B is in contact with the seventh insulating layer 97.

The first light-shielding portion 51B reflects light output from the two light-emitting elements 3 disposed side by side with the first light-shielding portion 51B interposed therebetween. The first light-shielding portion 51B provided between the first light-emitting element 3R and the second light-emitting element 3G, for example, reflects light output from the first side surface 3a of the second light-emitting element 3G and light output from the second side surface 3b of the first light-emitting element 3R. The first light-shielding portion 51B provided between the second light-emitting element 3G and the third light-emitting element 3B reflects light output from the first side surface 3a of the third light-emitting element 3B and light output from the second side surface 3b of the second light-emitting element 3G. Consequently, the display device 1C can prevent color mixture of the light L in different colors output from the light-emitting elements 3 disposed side by side in the first direction Dx.

Fifth Embodiment

Figure 15:
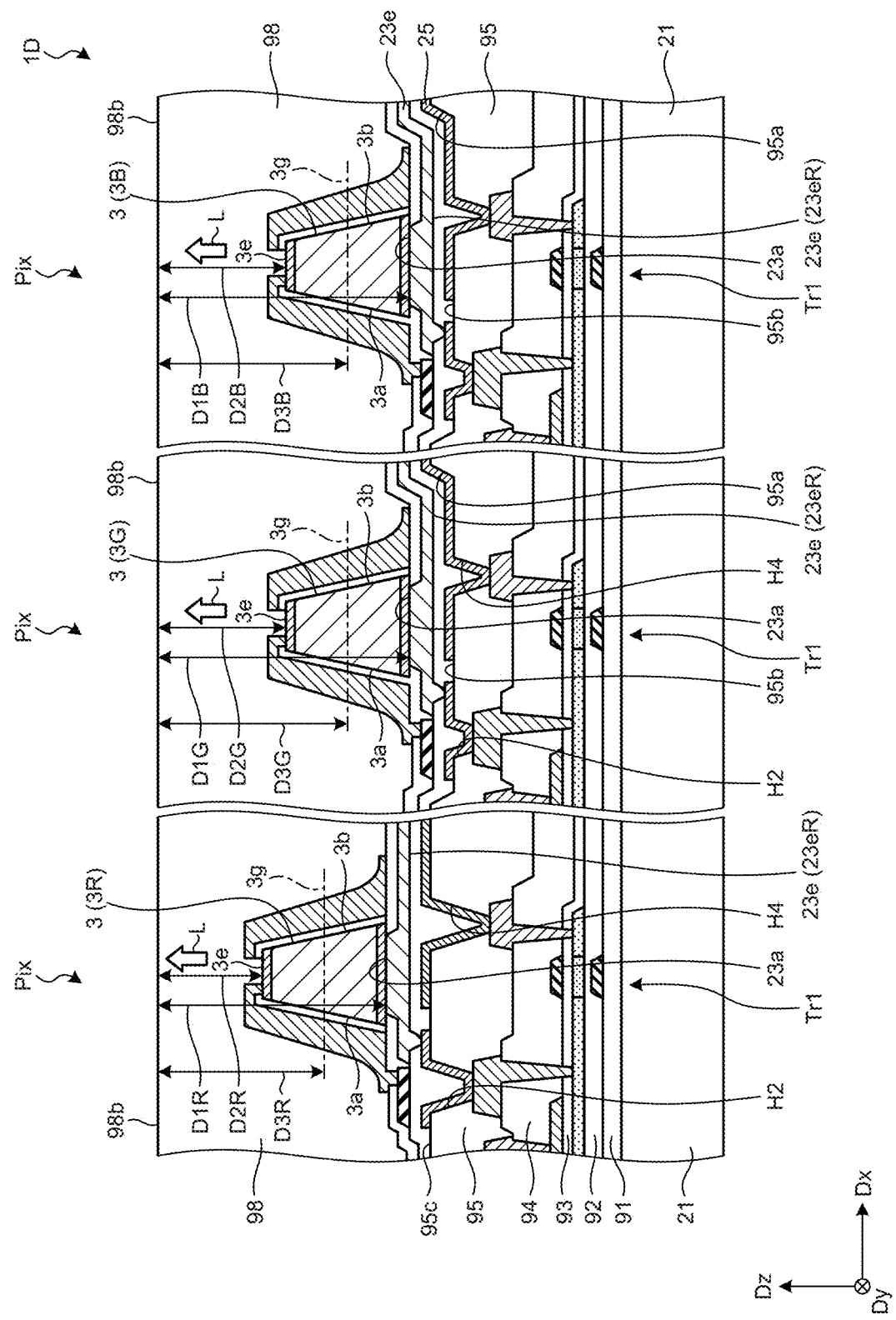
FIG. 15 is a sectional view of a plurality of pixels of the display device according to a fifth embodiment.

FIG. 15 is a sectional view of a plurality of pixels of the display device according to a fifth embodiment. In a display device 1D according to the present embodiment, the second light-emitting element 3G and the third light-emitting element 3B are provided in respective recesses 95a formed in the fifth insulating layer 95. The distance between a bottom surface 95b of the recess 95a and the substrate 21 in the third direction Dz is shorter than the distance between a surface 95c of the fifth insulating layer 95 and the substrate 21 in the third direction Dz. In other words, the distance between the bottom surface 95b of the recess 95a and the surface 98b of the flattening layer 98 in the third direction Dz is longer than the distance between the surface 95c of the fifth insulating layer 95 and the surface 98b of the flattening layer 98 in the third direction Dz. The surface 95c of the fifth insulating layer 95 means the part not provided with the recess 95a or the contact hole H2 or H4 in the surface of the fifth insulating layer 95.

Out of the second electrodes 23e, the electrode coupled to the anode of the first light-emitting element 3R is referred to as a first coupling electrode 23eR. The electrode coupled to the anode of the second light-emitting element 3G is referred to as a second coupling electrode 23eG. The electrode coupled to the anode of the third light-emitting element 3B is referred to as a third coupling electrode 23eB. The first coupling electrode 23eR, the second coupling electrode 23eG, and the third coupling electrode 23eB each have a placement surface 23a coupled to the anode of the corresponding light-emitting element 3.

A first distance D1R is the distance between the placement surface 23a of the first coupling electrode 23eR and the surface 98b of the flattening layer 98 in the third direction Dz. A second distance D1G is the distance between the placement surface 23a of the second coupling electrode 23eG and the surface 98b of the flattening layer 98 in the third direction Dz. A third distance D1B is the distance between the placement surface 23a of the third coupling electrode 23eB and the surface 98b of the flattening layer 98 in the third direction Dz. The first distance D1R is shorter than the second distance D1G and the third distance D1B. More preferably, the first distance D1R is shorter than the second distance D1G, and the second distance D1G is shorter than the third distance D1B.

A fourth distance D2R is the distance between the upper surface 3e of the first light-emitting element 3R and the surface 98b of the flattening layer 98 in the third direction Dz. A fifth distance D2G is the distance between the upper surface 3e of the second light-emitting element 3G and the surface 98b of the flattening layer 98 in the third direction DZ. A sixth distance D2B is the distance between the upper surface 3e of the third light-emitting element 3B and the surface 98b of the flattening layer 98 in the third direction Dz. The fourth distance D2R is shorter than the fifth distance D2G and the sixth distance D2B. More preferably, the fourth distance D2R is shorter than the fifth distance D2G, and the fifth distance D2G is shorter than the sixth distance D2B.

A seventh distance D3R is the distance between a light-emission surface 3g of the first light-emitting element 3R and the surface 98b of the flattening layer 98 in the third direction Dz. An eighth distance D3G is the distance between the light-emission surface 3g of the second light-emitting element 3G and the surface 98b of the flattening layer 98 in the third direction Dz. A ninth distance D3B is the distance between the light-emission surface 3g of the third light-emitting element 3B and the surface 98b of the flattening layer 98 in the third direction Dz. The seventh distance D3R is shorter than the eighth distance D3G and the ninth distance D3B. More preferably, the seventh distance D3R is shorter than the eighth distance D3G, and the eighth distance D3G is shorter than the ninth distance D3B.

With this configuration, the display device 1D can control the extraction efficiency of the light L from the light-emitting elements 3 for the individual pixels Pix. In the present specification, the extraction efficiency of the light L indicates the ratio of the intensity of light output from the surface 98b of the flattening layer 98 to the intensity of the light L output from the light-emitting element 3. If the luminous efficiency of the first light-emitting element 3R is lower than that of the second light-emitting element 3G and the third light-emitting element 3B, the display device 1D can reduce variations between the pixels Pix in the intensity of light output from the surface 98b of the flattening layer 98. The first light-shielding portion 51 and the second light-shielding portion 52 restrict the direction of the light L output from the light-emitting element 3. Consequently, the display device 1D can effectively control the extraction efficiency of the light L by adjusting the positions of the light-emitting elements 3 in the third direction Dz.

The display device 1D does not necessarily have the second light-emitting element 3G and the third light-emitting element 3B in the respective recesses 95a of the fifth insulating layer 95. The display device 1D simply needs to be able to adjust the positions of the respective light-emitting elements 3 in the third direction Dz. The display device 1D, for example, may include a placement part having different heights corresponding to the respective light-emitting elements 3 on the second electrodes 23e. Alternatively, in the display device 1D, the thickness of the substrates included in the respective light-emitting elements 3 may differ depending on the colors of the light L.

Sixth Embodiment

Figure 16:
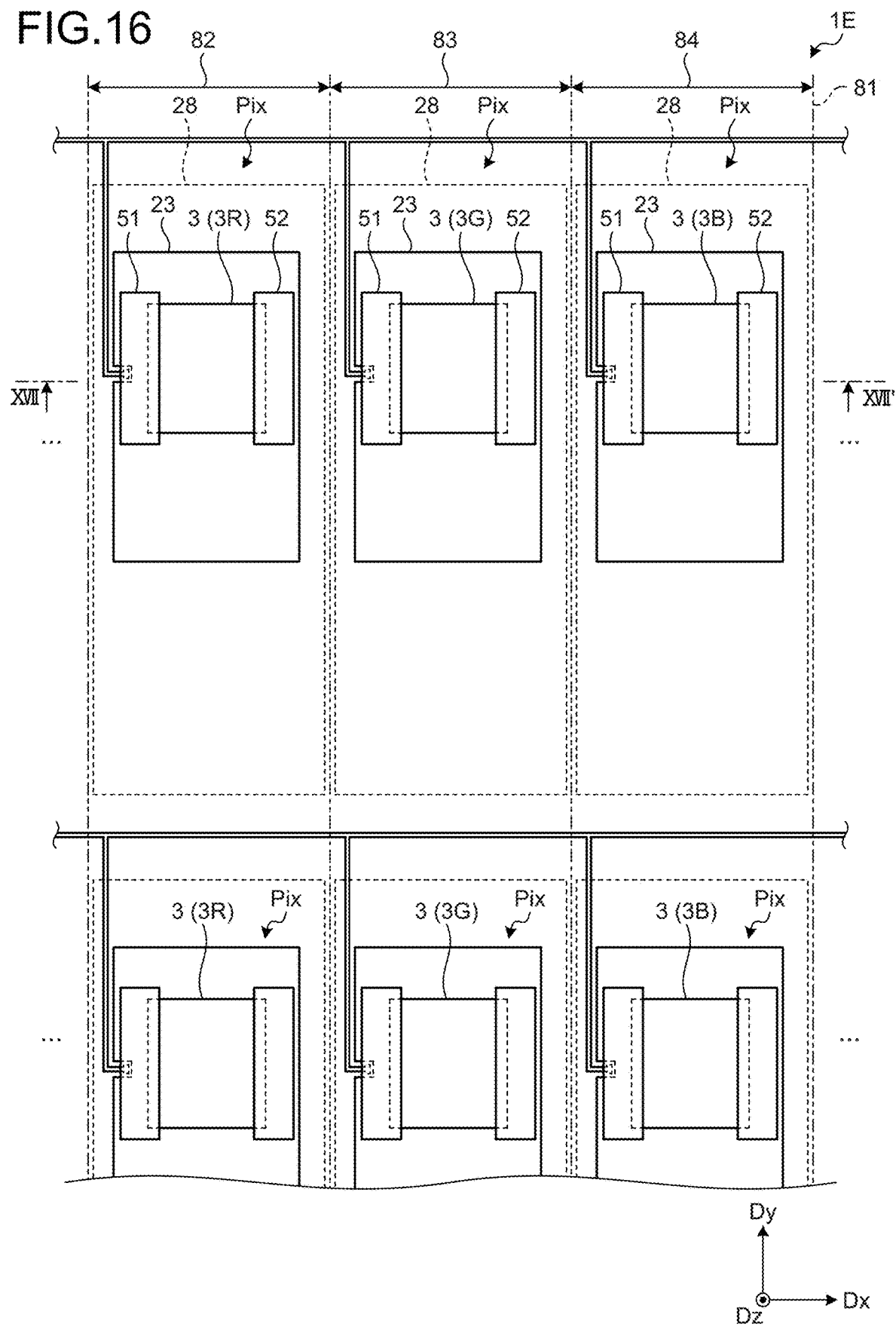
FIG. 16 is a plan view of a plurality of pixels of the display device according to a sixth embodiment.
Figure 17:
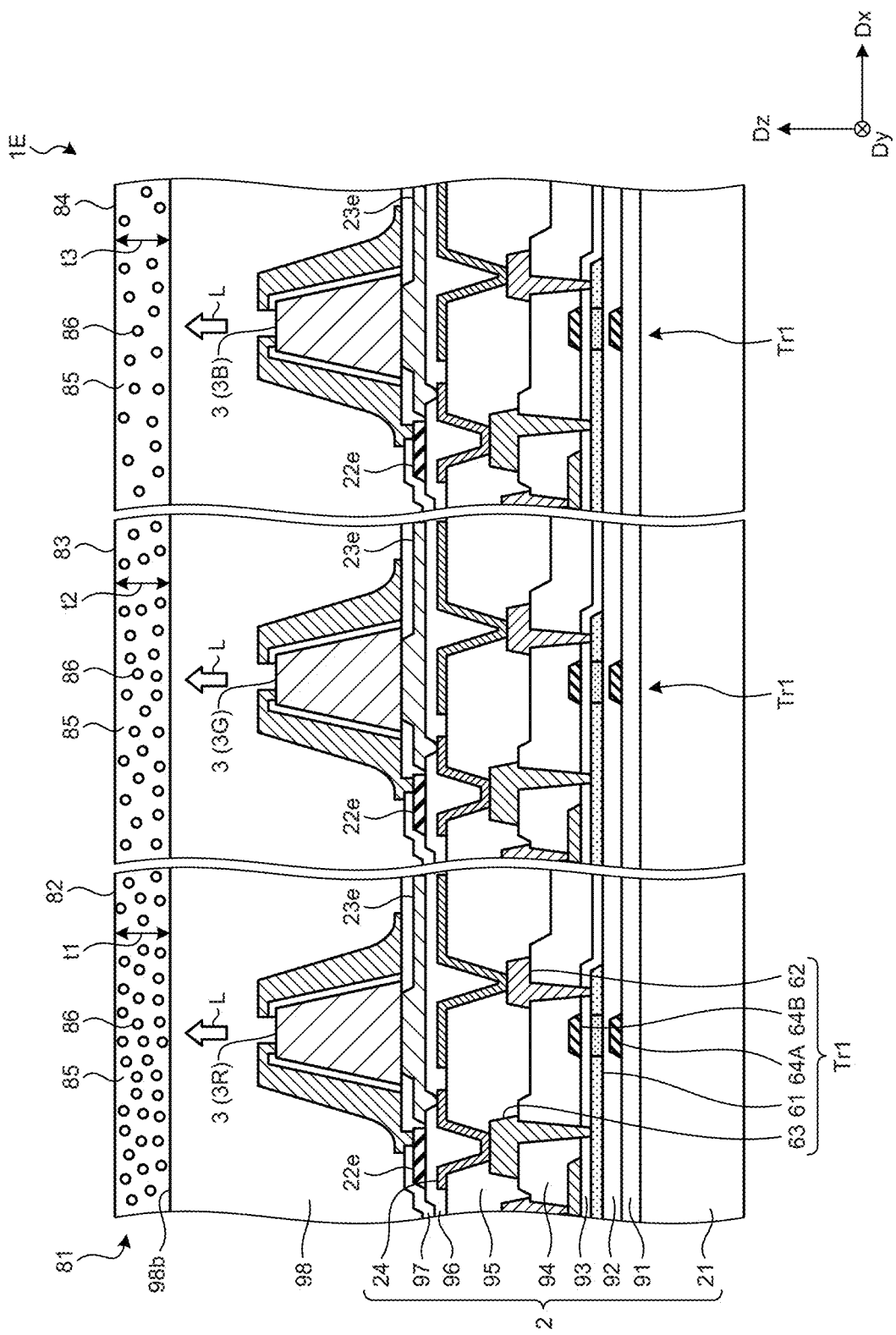
FIG. 17 is a sectional view along line XVII-XVII' of FIG. 16.

FIG. 16 is a plan view of a plurality of pixels of the display device according to a sixth embodiment. FIG. 17 is a sectional view along line XVII-XVII' of FIG. 16. As illustrated in FIG. 16, a display device 1E according to the present embodiment includes a scattering member 81. The scattering member 81 is provided over the surfaces of the pixels Pix to scatter and output the light L from the light-emitting elements 3. The scattering member 81 includes a first scattering region 82, a second scattering region 83, and a third scattering region 84 having different scattering intensities.

The first scattering region 82 overlaps the pixels Pix each including the first light-emitting element 3R. The second scattering region 83 overlaps the pixels Pix each including the second light-emitting element 3G. The third scattering region 84 overlaps the pixels Pix each including the third light-emitting element 3B. The first scattering region 82, the second scattering region 83, and the third scattering region 84 are disposed side by side in the first direction Dx. The first scattering region 82, the second scattering region 83, and the third scattering region 84 extend in the second direction Dy and are each disposed overlapping the pixels Pix including the light-emitting elements 3 in the same color.

As illustrated in FIG. 17, the scattering member 81 is provided on the surface 98b of the flattening layer 98. The scattering member 81 includes a translucent dielectric layer 85 and a plurality of scattering particles 86 dispersed in the dielectric layer 85. Examples of the material of the dielectric layer 85 include, but are not limited to, silicon oxide ($SiO_2$), silicon nitride (SiN), silicon oxynitride (SiON), aluminum oxide ($Al_2O_3$), acrylic resin, epoxy resin, silicone resin, etc. The scattering particle 86 is made of metal material, such as molybdenum (Mo), titanium (Ti), titanium nitride (TiN), aluminum (Al), copper (Cu), and silver (Ag), or alloy material including any of these materials as a main component, for example. The scattering member 81 can be applied and formed in each region by ink-jet printing, for example.

The particle diameter of the scattering particle 86 is equal to or smaller than one-tenth the wavelength of the light L. In this case, the light L passing through the scattering member 81 is scattered by Rayleigh scattering. The relative scattering intensity of Rayleigh scattering is inversely proportional to the fourth power of the wavelength of the light L. In other words, the wavelength becomes shorter, and the relative scattering intensity of Rayleigh scattering becomes higher in the order of the red light L, the green light L, and the blue light L.

The density of the scattering particles 86 of the first scattering region 82 according to the present embodiment is higher than that of the scattering particles 86 of the second scattering region 83 and the third scattering region 84. More preferably, the density of the scattering particles 86 becomes higher in the order of the third scattering region 84, the second scattering region 83, and the first scattering region 82. The scattering particles 86 in the regions are made of the same material and have the same particle diameter. Thicknesses t1, t2, and t3 of the scattering member 81 in the respective regions are equal. The density of the scattering particles 86 is the number of scattering particles 86 per unit volume of the scattering member 81. If the light L has the same wavelength, the scattering intensity when the light L is passing through the scattering member 81 becomes higher in the order of the third scattering region 84, the second scattering region 83, and the first scattering region 82. Consequently, the light L in different colors (wavelengths) output from the first light-emitting element 3R, the second light-emitting element 3G, and the third light-emitting element 3B has a smaller difference in the scattering intensity caused by Rayleigh scattering by being scattered and output from the first scattering region 82, the second scattering region 83, and the third scattering region 84, respectively.

Figure 18:
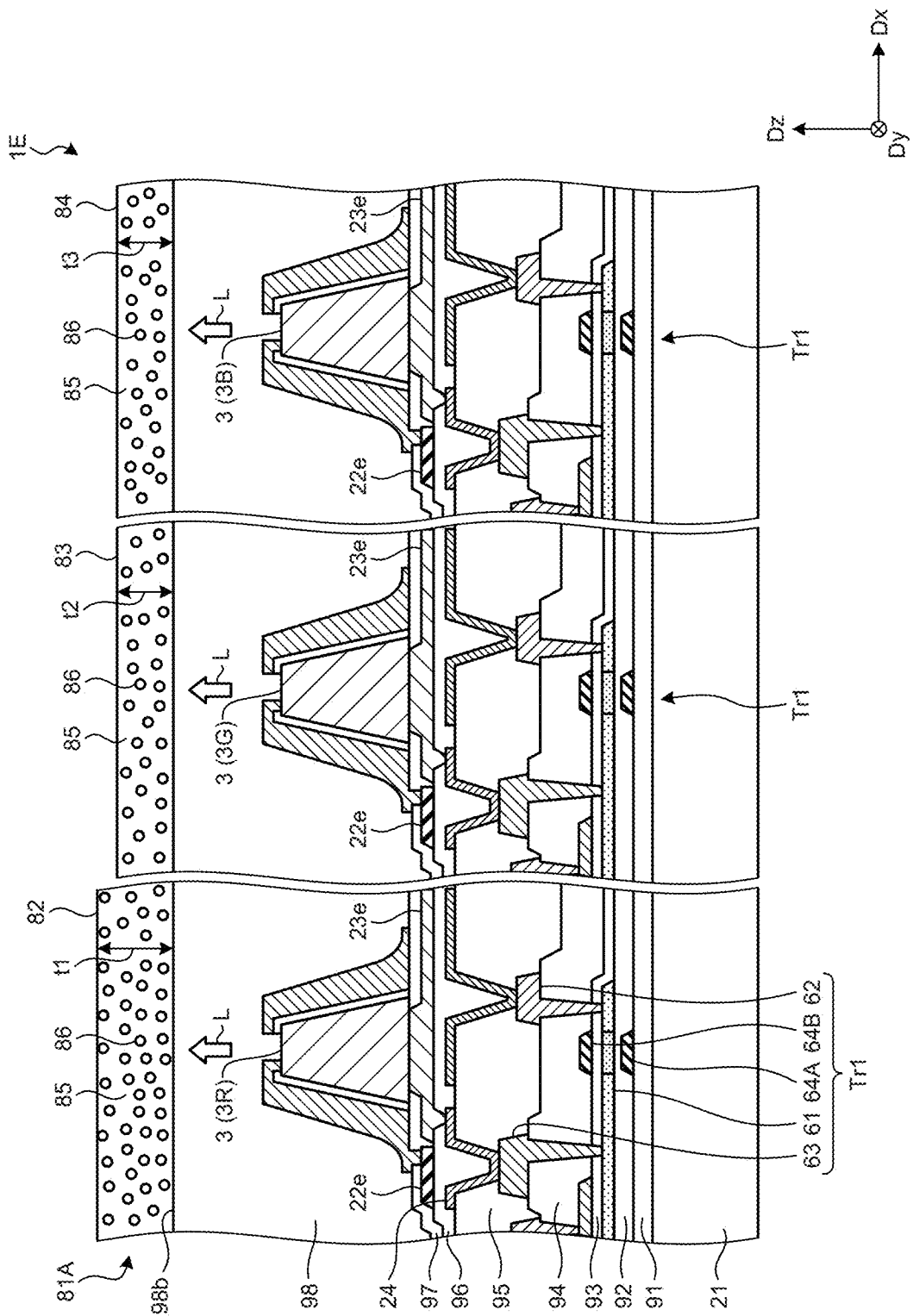
FIG. 18 is a sectional view of a plurality of pixels of the display device according to a modification of the sixth embodiment.

FIG. 18 is a sectional view of a plurality of pixels of the display device according to a modification of the sixth embodiment. The first scattering region 82, the second scattering region 83, and the third scattering region 84 according to the present modification have the same density of the scattering particles 86. The thickness t1 of the first scattering region 82 is thicker than the thickness t2 of the second scattering region 83 and the thickness t3 of the third scattering region 84. More preferably, the thickness becomes thicker in the order of the thickness t3 of the third scattering region 84, the thickness t2 of the second scattering region 83, and the thickness t1 of the first scattering region 82. Also in the present modification, if the light L has the same wavelength, the scattering intensity becomes higher in the order of the third scattering region 84, the second scattering region 83, and the first scattering region 82. Consequently, the light L in different colors output from the first light-emitting element 3R, the second light-emitting element 3G, and the third light-emitting element 3B has a smaller difference in the scattering intensity caused by Rayleigh scattering.

The configuration of the scattering member 81 and the material of the scattering particle 86 may be appropriately modified. The scattering particle 86, for example, may be a particle having a particle diameter of approximately one-half the wavelength of the light L. In this case, the scattering particle 86 is made of translucent material, and the light L passing through the scattering member 81 is scattered by Mie scattering. In Mie scattering, the scattering intensity does not depend on the wavelength. Consequently, the first scattering region 82, the second scattering region 83, and the third scattering region 84 in the scattering member 81 have the same density of the scattering particles 86. In addition, the thickness t3 of the third scattering region 84, the thickness t2 of the second scattering region 83, and the thickness of the first scattering region 82 can be made equal.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiments above and the modifications thereof.

Figure 19:
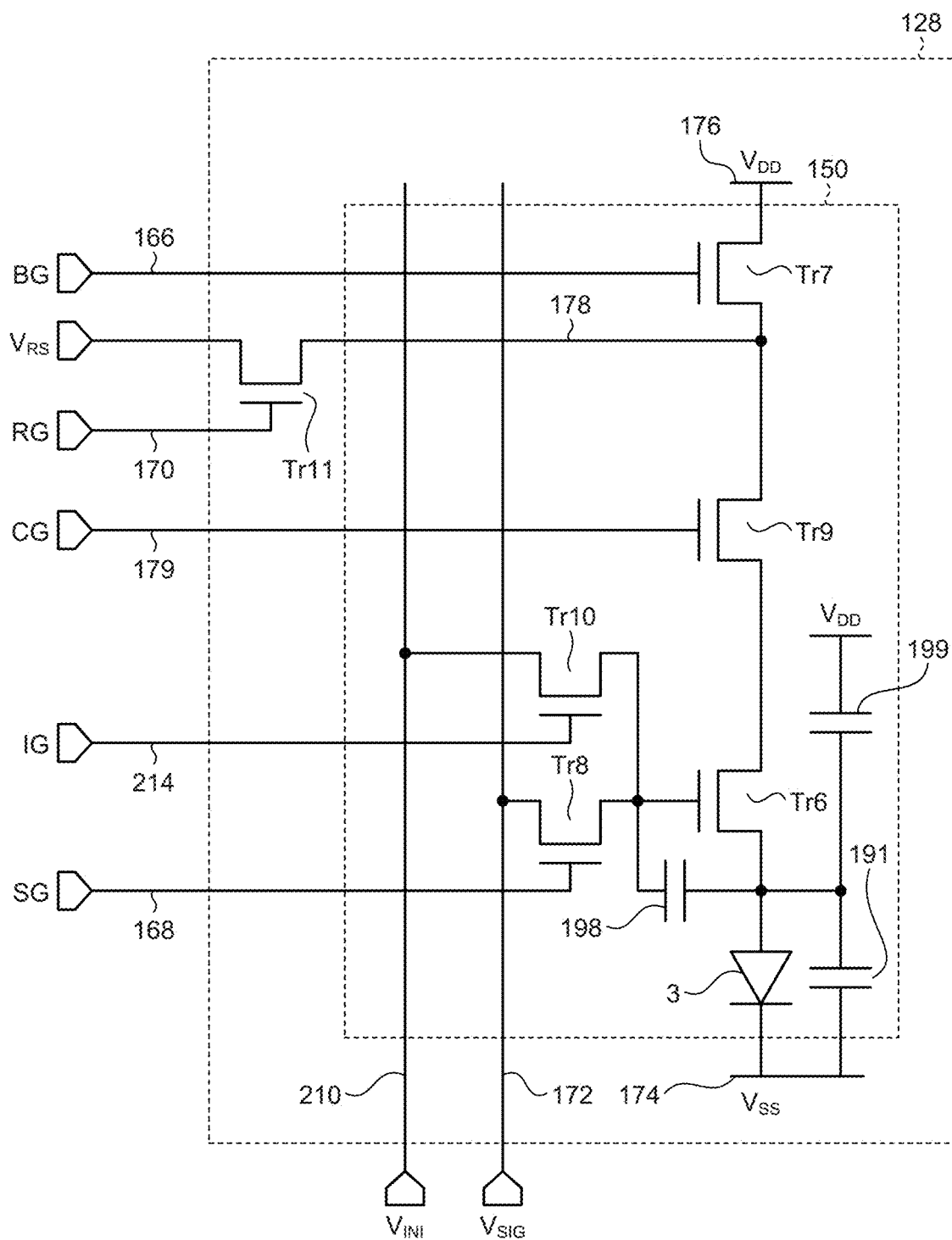
FIG. 19 is a circuit diagram of a modification of the pixel circuit.

The pixel circuit 28, for example, does not necessarily have the configuration illustrated in FIG. 7. FIG. 19 is a circuit diagram of a modification of the pixel circuit. As illustrated in FIG. 19, a pixel circuit 128 includes a drive transistor Tr6, a lighting switch Tr7, a writing switch Tr8, a light-emission control switch Tr9, an initialization switch Tr10, and a reset switch Tr11.

The cathode (cathode terminal 22p) of the light-emitting element 3 is coupled to a power-supply line 174. The anode (anode terminal 23p) of the light-emitting element 3 is coupled to a power-supply line 176 via the drive transistor Tr6 and the lighting switch Tr7.

The power-supply line 176 is supplied with a predetermined high voltage as drive potential $V_{DD}$ from a drive power source. The power-supply line 174 is supplied with a predetermined low voltage as reference potential $V_{SS}$ from a power-supply circuit.

The light-emitting element 3 is supplied with a forward current (drive current) and emits light by the potential difference ($V_{DD}$-$V_{SS}$) between the drive potential $V_{DD}$ and the reference potential $V_{SS}$. In other words, the drive potential $V_{DD}$ has a potential difference for causing the light-emitting element 3 to emit light with respect to the reference potential $V_{SS}$. Capacitance 191 serving as an equivalent circuit is provided between the anode terminal 23p and the cathode terminal 22p and coupled in parallel with the light-emitting element 3. Additional capacitance 199 is provided between the anode terminal 23p of the light-emitting element 3 and the power-supply line 176 that supplies the drive potential $V_{DD}$. The capacitance 191 may be coupled to a reference potential other than the anode terminal 23p and the cathode terminal 22p.

The drive transistor Tr6, the lighting switch Tr7, and the light-emission control switch Tr9 according to the present embodiment are n-type TFTs. The source electrode of the drive transistor Tr6 is coupled to the anode terminal 23p of the light-emitting element 3, and the drain electrode thereof is coupled to the source electrode of the light-emission control switch Tr9. The gate electrode of the light-emission control switch Tr9 is coupled to a light-emission control line 179. The drain electrode of the light-emission control switch Tr9 is coupled to the source electrode of the lighting switch Tr7. The gate electrode of the lighting switch Tr7 is coupled to a lighting control line 166. The drain electrode of the lighting switch Tr7 is coupled to the power-supply line 176. The gate electrode of the reset switch Tr11 is coupled to a reset control line 170. The gate electrode of the writing switch Tr8 is coupled to a writing control line 168. The gate electrode of the initialization switch Tr10 is coupled to an initialization control line 214.

The drain electrode of the drive transistor Tr6 is also coupled to a reset power source via the reset switch Tr11. In the present modification, reset lines 178 and the reset switches Tr1 are provided to respective pixel rows. The reset lines 718 each extend along the corresponding pixel row. The reset line 178 is coupled in common to the drain electrodes of the drive transistors Tr6 of the corresponding pixel row via the light-emission control switches Tr9 of the corresponding pixel row. In other words, the pixels Pix constituting the pixel row share the reset line 178 and the reset switch Tr11. The reset switch Tr1 is disposed at an end of the pixel row, for example, and switches coupling and decoupling between the reset line 178 and the reset power source, that is, determines whether to couple or decouple between them. The reset switch Tr11 according to the present modification is an n-type TFT like the drive transistor Tr6, the lighting switch Tr7, and the light-emission control switch Tr9.

The gate electrode serving as a control terminal of the drive transistor Tr6 is coupled to a video signal line 172 via the writing switch Tr8 and coupled to an initialization signal line 210 via the initialization switch Tr10. Holding capacitance 198 is coupled between the gate electrode and the source electrode of the drive transistor Tr6. The writing switch Tr8 and the initialization switch Tr10 according to the present embodiment are n-type TFTs like the drive transistor Tr6, the lighting switch Tr7, and the reset switch Tr11.

While the present embodiment describes a circuit example in which the drive transistor Tr6, the lighting switch Tr7, the reset switch Tr11, the writing switch Tr8, the light-emission control switch Tr9, and the initialization switch Tr10 are n-type TFTs, the present embodiment is not limited thereto. The drive transistor Tr6, the lighting switch Tr7, the reset switch Tr11, the writing switch Tr8, the light-emission control switch Tr9, and the initialization switch Tr10 may be p-type TFTs. Alternatively, the present embodiment has a circuit configuration combining p-type TFTS and n-type TFTs.

FIG. 19 illustrates various signals, including a writing control signal SG supplied to the writing switch Tr8, a lighting control signal BG supplied to the lighting switch Tr7, a reset control signal RG supplied to the reset switch Tr11, a light-emission control signal CG supplied to the light-emission control switch Tr9, and an initialization control signal IG supplied to the initialization switch Tr10.

The present modification selects a plurality of pixel rows in order from the first row (e.g., the pixel row positioned at the uppermost part of the display region AA in FIG. 1). Subsequently, the present modification writes electric potential Vsig (video writing potential) of video voltage signals VSIG to the pixels Pix of the selected pixel rows and repeats the operation of causing the light-emitting elements 3 to emit light in units of an image of one frame. The drive circuit applies the electric potential Vsig (video writing potential) of the video voltage signals VSIG to the video signal line 172 and applies electric potential Vini (initialization potential) of initialization voltage signals VINI to the initialization signal line 210 in each horizontal scanning period.

The writing operation according to the present modification can be specifically divided into a reset operation, an offset canceling operation, and a video signal setting operation. The reset operation is an operation for resetting the voltage held in the capacitance 191, the holding capacitance 198, and the additional capacitance 199. The offset canceling operation is an operation for compensating fluctuations in a threshold voltage Vth of the drive transistor Tr6. The video signal setting operation is an operation for writing the electric potential Vsig (video writing potential) of the video voltage signals VSIG to the pixels Pix.

The writing operation (the reset operation, the offset canceling operation, and the video signal setting operation) and the light-emitting operation are sequentially performed pixel row by pixel row. The pixel row is sequentially selected in a cycle of one horizontal scanning period for the video signals, for example. The writing operation and the light-emitting operation performed pixel row by pixel row are repeated in one frame period.

The light-emission enable period of each pixel row is set to a period from the end of the video signal setting operation to the start of the writing operation for the pixel row in the image of the next frame. In the light-emission enable period, the display device 1 has a light-emission period and a non-light-emission period. The light-emission period is a period for causing the light-emitting elements 3 to emit light with the intensity corresponding to the electric potential Vsig (video writing potential) of the video voltage signals VSIG written to the respective pixels Pix. The non-light-emission period is a period for forcibly stopping the drive current supplied to the light-emitting elements 3. Specifically, in the light-emission period, the display device 1 switches the light-emission control signals CG to the H level to turn on the light-emission control switch Tr9, thereby supplying the forward current (drive current) to the light-emitting elements 3 from the drive power source. In the non-light-emission period, the display device 1 switches the light-emission control signals CG to the L level to turn off the light-emission control switch Tr9, thereby decoupling the drive power source and the drive transistor Tr6 held in the coupled state. As a result, the display device 1 forcibly stops the forward current (drive current) to be supplied to the light-emitting elements 3.

What is claimed is:

1. A display device comprising:
   a substrate;
   a plurality of pixels arrayed on the substrate;
   a plurality of inorganic light-emitting elements provided corresponding to the respective pixels and each having a first side surface and a second side surface opposite to the first side surface; and
   a first light-shielding portion electrically coupled to a cathode of the corresponding inorganic light-emitting element and that prevents output of light traveling in a direction intersecting the first side surface of the inorganic light-emitting element,
   wherein
   the inorganic light-emitting elements include a first inorganic light-emitting element, a second inorganic light-emitting element, and a third inorganic light-emitting element configured to output light in different colors,
   a flattening layer covers at least a side surface of the first inorganic light-emitting element, the second inorganic light-emitting element, and the third inorganic light-emitting element,
   the substrate is provided with a first coupling electrode, a second coupling electrode, and a third coupling electrode coupled to anodes of the first inorganic light-emitting element, the second inorganic light-emitting element, and the third inorganic light-emitting element, respectively, and
   a distance between a surface of the flattening layer and the first coupling electrode in a direction perpendicular to the substrate is shorter than a distance between the surface of the flattening layer and the second coupling electrode and a distance between the surface of the flattening layer and the third coupling electrode.

2. The display device according to claim 1, further comprising a second light-shielding portion that prevents output of light traveling in a direction intersecting the second side surface of the inorganic light-emitting element.

3. The display device according to claim 2, wherein
   the inorganic light-emitting elements configured to output light in different colors are arrayed side by side in a first direction, and the inorganic light-emitting elements configured to output light in a same color are arrayed side by side in a second direction intersecting the first direction,
   the first side surface and the second side surface of each of the inorganic light-emitting elements are provided intersecting the first direction,
   the first light-shielding portion faces the first side surface, and the second light-shielding portion faces the second side surface, and
   a third side surface and a fourth side surface between the first side surface and the second side surface are exposed between the first light-shielding portion and the second light-shielding portion.

4. The display device according to claim 2, wherein
   the inorganic light-emitting elements configured to output light in different colors are arrayed side by side in a first direction, and the inorganic light-emitting elements configured to output light in different colors are arrayed side by side in a second direction intersecting the first direction, the first light-shielding portion faces the first side surface, and the second light-shielding portion faces the second side surface, the inorganic light-emitting element has a third side surface and a fourth side surface between the first side surface and the second side surface, and the display device comprises a third light-shielding portion facing the third side surface and a fourth light-shielding portion facing the fourth side surface.

5. The display device according to claim 4, wherein a width of the third light-shielding portion and the fourth light-shielding portion in the first direction is larger than a width of the inorganic light-emitting element in the first direction.

6. The display device according to claim 2, further comprising a first electrode provided to a surface of the flattening layer and electrically coupled to the cathode of the inorganic light-emitting element, wherein the first light-shielding portion and the second light-shielding portion are provided to the first electrode at positions overlapping the first side surface and the second side surface, respectively, when viewed from a direction perpendicular to the substrate.

7. The display device according to claim 1, further comprising a first electrode provided to a surface of the flattening layer and electrically coupled to the cathode of the inorganic light-emitting element, wherein the first light-shielding portion is provided in a groove extending in a thickness direction from a surface of the flattening layer.

8. The display device according to claim 3, wherein a width of the first light-shielding portion in the second direction is larger than a width of the inorganic light-emitting element in the second direction.

9. The display device according to claim 1, further comprising a scattering member provided on the flattening layer to cover the first inorganic light-emitting element, the second inorganic light-emitting element, and the third inorganic light-emitting element and including a plurality of scattering particles, wherein the scattering member includes a first scattering region overlapping the first inorganic light-emitting element, a second scattering region overlapping the second inorganic light-emitting element, and a third scattering region overlapping the third inorganic light-emitting element, and density of the scattering particles of the first scattering region is higher than density of the scattering particles of the second scattering region and the third scattering region.

10. The display device according to claim 1, wherein the first inorganic light-emitting element outputs red light, the second inorganic light-emitting element outputs green light, and the third inorganic light-emitting element outputs blue light.

11. The display device according to claim 1, further comprising:

a switching element provided to the substrate corresponding to each of the inorganic light-emitting elements; and a second electrode provided to the substrate and that electrically couples the anode of the inorganic light-emitting element and the switching element, wherein the second electrode has a larger area than the inorganic light-emitting element when viewed from a direction perpendicular to the substrate.

* * * * *